United States Patent
Maher et al.

(10) Patent No.: US 10,935,633 B2
(45) Date of Patent: Mar. 2, 2021

(54) PROGRAMMABLE CODE GENERATION FOR RADAR SENSING SYSTEMS

(71) Applicant: UHNDER, INC., Austin, TX (US)

(72) Inventors: Monier Maher, St. Louis, MO (US); Jean Pierre Bordes, St. Charles, MO (US); Wayne E. Stark, Ann Arbor, MI (US); Raghunath Krishna Rao, Austin, TX (US); Frederick Rush, Austin, TX (US); Curtis Davis, St. Louis, MO (US); Srikanth Gollapudi, Austin, TX (US); Steve Borho, St. Charles, MO (US); Murtaza Ali, Cedar Park, TX (US)

(73) Assignee: Uhnder, Inc., Austin, TX (US)

( * ) Notice: Subject to any disclaimer, the term of this patent is extended or adjusted under 35 U.S.C. 154(b) by 0 days.

(21) Appl. No.: 16/884,155

(22) Filed: May 27, 2020

(65) Prior Publication Data

US 2020/0284873 A1    Sep. 10, 2020

Related U.S. Application Data

(63) Continuation of application No. 15/892,865, filed on Feb. 9, 2018, now Pat. No. 10,670,695.

(Continued)

(51) Int. Cl.
*G01S 7/35* (2006.01)
*G01S 13/06* (2006.01)
(Continued)

(52) U.S. Cl.
CPC ............. *G01S 7/352* (2013.01); *G01S 7/032* (2013.01); *G01S 7/354* (2013.01); *G01S 13/06* (2013.01);
(Continued)

(58) Field of Classification Search
CPC .......... G01S 7/352; G01S 7/032; G01S 7/354; G01S 13/06; G01S 13/42; G01S 13/584;
(Continued)

(56) References Cited

U.S. PATENT DOCUMENTS

| 1,882,128 A | 10/1932 | Fearing |
| 3,374,478 A | 3/1968 | Blau |

(Continued)

FOREIGN PATENT DOCUMENTS

| EP | 0725480 | 11/2011 |
| EP | 2374217 | 4/2013 |

(Continued)

OTHER PUBLICATIONS

Chambers et al., "An article entitled Real-Time Vehicle Mounted Multistatic Ground Penetrating Radar Imaging System for Buried Object Detection," Lawrence Livermore National Laboratory Reports (LLNL-TR-615452), Feb. 4, 2013; Retrieved from the Internet from https://e-reports-ext.llnl.gov/pdf/711892.pdf.

(Continued)

*Primary Examiner* — Peter M Bythrow
(74) *Attorney, Agent, or Firm* — Gardner, Linn, Burkhart & Ondersma LLP

(57) ABSTRACT

A radar sensing system for a vehicle has multiple transmitters and receivers on a vehicle. The transmitters are configured to transmit radio signals which are reflected off of objects in the environment. There are one or more receivers that receive the reflected radio signals. Each receiver has an antenna, a radio frequency front end, an analog-to-digital converter (ADC), and a digital signal processor. The transmitted signals are based on spreading codes generated by a programmable code generation unit. The receiver also makes use of the spreading codes generated by the programmable code generation unit. The programmable code gen- (Continued)

eration unit is configured to selectively generate particular spreading codes that have desired properties.

20 Claims, 14 Drawing Sheets

Related U.S. Application Data

(60) Provisional application No. 62/457,394, filed on Feb. 10, 2017.

(51) Int. Cl.

| | |
|---|---|
| *G01S 13/931* | (2020.01) |
| *G01S 13/64* | (2006.01) |
| *G01S 7/03* | (2006.01) |
| *G01S 13/87* | (2006.01) |
| *G01S 13/42* | (2006.01) |
| *G01S 13/58* | (2006.01) |
| *G11C 11/409* | (2006.01) |
| *G01S 7/285* | (2006.01) |
| *G01S 7/40* | (2006.01) |
| *G01S 13/32* | (2006.01) |
| *G01S 13/34* | (2006.01) |
| *G06F 7/72* | (2006.01) |

(52) U.S. Cl.
CPC ............ *G01S 13/42* (2013.01); *G01S 13/584* (2013.01); *G01S 13/64* (2013.01); *G01S 13/87* (2013.01); *G01S 13/931* (2013.01); *G11C 11/409* (2013.01); *G01S 7/285* (2013.01); *G01S 7/4017* (2013.01); *G01S 7/4021* (2013.01); *G01S 13/325* (2013.01); *G01S 13/34* (2013.01); *G01S 13/878* (2013.01); *G01S 2013/93271* (2020.01); *G01S 2013/93272* (2020.01); *G01S 2013/93274* (2020.01); *G06F 7/724* (2013.01)

(58) Field of Classification Search
CPC ........ G01S 13/64; G01S 13/87; G01S 13/931; G01S 2013/93274; G01S 2013/93271; G01S 2013/93272; G01S 7/285; G01S 7/4017; G01S 7/4021; G01S 13/325; G01S 13/34; G01S 13/878; G11C 11/409; G06F 7/724

See application file for complete search history.

(56) References Cited

U.S. PATENT DOCUMENTS

| | | |
|---|---|---|
| 3,735,398 A | 5/1973 | Ross |
| 3,750,169 A | 7/1973 | Strenglein |
| 3,766,554 A | 10/1973 | Tresselt |
| 3,896,434 A | 7/1975 | Sirven |
| 3,932,871 A | 1/1976 | Foote |
| 4,078,234 A | 3/1978 | Fishbein et al. |
| 4,176,351 A | 11/1979 | De Vita et al. |
| 4,308,536 A | 12/1981 | Sims, Jr. et al. |
| 4,566,010 A | 1/1986 | Collins |
| 4,612,547 A | 9/1986 | Itoh |
| 4,882,668 A | 11/1989 | Schmid et al. |
| 4,910,464 A | 3/1990 | Trett et al. |
| 4,939,685 A | 7/1990 | Feintuch |
| 5,001,486 A | 3/1991 | Bächtiger |
| 5,012,254 A | 4/1991 | Thompson |
| 5,034,906 A | 7/1991 | Chang |
| 5,087,918 A | 2/1992 | May et al. |
| 5,151,702 A | 9/1992 | Urkowitz |
| 5,175,710 A | 12/1992 | Hutson |
| 5,218,619 A | 6/1993 | Dent |
| 5,272,663 A | 12/1993 | Jones et al. |
| 5,280,288 A | 1/1994 | Sherry et al. |
| 5,302,956 A | 4/1994 | Asbury et al. |
| 5,341,141 A | 8/1994 | Frazier et al. |
| 5,345,470 A | 9/1994 | Alexander |
| 5,361,072 A | 11/1994 | Barrick et al. |
| 5,376,939 A | 12/1994 | Urkowitz |
| 5,379,322 A | 1/1995 | Kosaka et al. |
| 5,497,162 A | 3/1996 | Kaiser |
| 5,508,706 A | 4/1996 | Tsou et al. |
| 5,581,464 A | 12/1996 | Woll et al. |
| 5,654,715 A | 8/1997 | Hayashikura et al. |
| 5,657,021 A | 8/1997 | Ehsani-Nategh et al. |
| 5,657,023 A | 8/1997 | Lewis et al. |
| 5,691,724 A | 11/1997 | Aker et al. |
| 5,712,640 A | 1/1998 | Andou |
| 5,724,041 A | 3/1998 | Inoue et al. |
| 5,847,661 A | 12/1998 | Ricci |
| 5,892,477 A | 4/1999 | Wehling |
| 5,917,430 A | 6/1999 | Greneker, III et al. |
| 5,920,285 A | 7/1999 | Benjamin |
| 5,931,893 A | 8/1999 | Dent et al. |
| 5,959,571 A | 9/1999 | Aoyagi et al. |
| 5,970,400 A | 10/1999 | Dwyer |
| 6,048,315 A | 4/2000 | Chiao et al. |
| 6,067,314 A | 5/2000 | Azuma |
| 6,069,581 A | 5/2000 | Bell et al. |
| 6,121,872 A | 9/2000 | Weishaupt |
| 6,121,918 A | 9/2000 | Tullsson |
| 6,151,366 A | 11/2000 | Yip |
| 6,163,252 A | 12/2000 | Nishiwaki |
| 6,184,829 B1 | 2/2001 | Stilp |
| 6,191,726 B1 | 2/2001 | Tullsson |
| 6,208,248 B1 | 3/2001 | Ross |
| 6,288,672 B1 | 9/2001 | Asano et al. |
| 6,307,622 B1 | 10/2001 | Lewis |
| 6,335,700 B1 | 1/2002 | Ashihara |
| 6,347,264 B2 | 2/2002 | Nicosia et al. |
| 6,400,308 B1 | 6/2002 | Bell et al. |
| 6,411,250 B1 | 6/2002 | Oswald et al. |
| 6,417,796 B1 | 7/2002 | Bowlds |
| 6,424,289 B2 | 7/2002 | Fukae et al. |
| 6,547,733 B2 | 4/2003 | Hwang et al. |
| 6,583,753 B1 | 6/2003 | Reed |
| 6,614,387 B1 | 9/2003 | Deadman |
| 6,624,784 B1 | 9/2003 | Yamaguchi |
| 6,674,908 B1 | 1/2004 | Aronov |
| 6,683,560 B2 | 1/2004 | Bauhahn |
| 6,714,956 B1 | 3/2004 | Liu et al. |
| 6,747,595 B2 | 6/2004 | Hirabe |
| 6,768,391 B1 | 7/2004 | Dent et al. |
| 6,865,218 B1 | 3/2005 | Sourour |
| 6,888,491 B2 | 5/2005 | Richter |
| 6,975,246 B1 | 12/2005 | Trudeau |
| 7,066,886 B2 * | 6/2006 | Song .................. G01S 7/52038 600/443 |
| 7,119,739 B1 | 10/2006 | Struckman |
| 7,130,663 B2 | 10/2006 | Guo |
| 7,202,776 B2 | 4/2007 | Breed |
| 7,289,058 B2 | 10/2007 | Shima |
| 7,299,251 B2 | 11/2007 | Skidmore et al. |
| 7,338,450 B2 | 3/2008 | Kristofferson et al. |
| 7,395,084 B2 | 7/2008 | Anttila |
| 7,460,055 B2 | 12/2008 | Nishijima et al. |
| 7,474,258 B1 | 1/2009 | Arikan et al. |
| 7,545,310 B2 | 6/2009 | Matsuoka |
| 7,545,321 B2 | 6/2009 | Kawasaki |
| 7,564,400 B2 | 7/2009 | Fukuda |
| 7,567,204 B2 | 7/2009 | Sakamoto |
| 7,609,198 B2 | 10/2009 | Chang |
| 7,642,952 B2 | 1/2010 | Fukuda |
| 7,663,533 B2 | 2/2010 | Toennesen |
| 7,667,637 B2 | 2/2010 | Pedersen et al. |
| 7,728,762 B2 | 6/2010 | Sakamoto |
| 7,791,528 B2 | 9/2010 | Klotzbuecher |
| 7,847,731 B2 | 12/2010 | Wiesbeck et al. |
| 7,855,677 B2 | 12/2010 | Negoro et al. |
| 7,859,450 B2 | 12/2010 | Shirakawa et al. |
| 8,019,352 B2 | 9/2011 | Rappaport et al. |
| 8,044,845 B2 | 10/2011 | Saunders |

(56) References Cited

U.S. PATENT DOCUMENTS

| | | |
|---|---|---|
| 8,049,663 B2 | 11/2011 | Frank et al. |
| 8,059,026 B1 | 11/2011 | Nunez |
| 8,102,306 B2 | 1/2012 | Smith, Jr. et al. |
| 8,115,672 B2 | 2/2012 | Nouvel et al. |
| 8,154,436 B2 | 4/2012 | Szajnowski |
| 8,169,359 B2 | 5/2012 | Aoyagi |
| 8,212,713 B2 | 7/2012 | Aiga et al. |
| 8,330,650 B2 | 12/2012 | Goldman |
| 8,390,507 B2 | 3/2013 | Wintermantel |
| 8,471,760 B2 | 6/2013 | Szajnowski |
| 8,532,159 B2 | 9/2013 | Kagawa et al. |
| 8,547,988 B2 | 10/2013 | Hadani et al. |
| 8,686,894 B2 | 4/2014 | Fukuda et al. |
| 8,694,306 B1 | 4/2014 | Short et al. |
| 8,994,581 B1 | 3/2015 | Brown |
| 9,121,943 B2 | 9/2015 | Stirlin-Gallacher et al. |
| 9,239,378 B2 | 1/2016 | Kishigami et al. |
| 9,239,379 B2 | 1/2016 | Burgio et al. |
| 9,274,217 B2 | 3/2016 | Chang et al. |
| 9,282,945 B2 | 3/2016 | Smith et al. |
| 9,335,402 B2 | 5/2016 | Maeno et al. |
| 9,400,328 B2 | 7/2016 | Hsiao et al. |
| 9,541,639 B2 | 1/2017 | Searcy et al. |
| 9,568,600 B2 | 2/2017 | Alland |
| 9,575,160 B1 | 2/2017 | Davis et al. |
| 9,599,702 B1 | 3/2017 | Bordes et al. |
| 9,689,967 B1 | 6/2017 | Stark et al. |
| 9,720,073 B1 | 8/2017 | Davis et al. |
| 9,720,080 B1 | 9/2017 | Rodenbeck |
| 9,753,121 B1 | 9/2017 | Davis |
| 9,753,132 B1 | 9/2017 | Bordes et al. |
| 9,772,397 B1 | 9/2017 | Bordes et al. |
| 9,791,551 B1 | 10/2017 | Eshraghi et al. |
| 9,791,564 B1 | 10/2017 | Harris et al. |
| 9,806,914 B1 | 10/2017 | Bordes et al. |
| 9,829,567 B1 | 11/2017 | Davis et al. |
| 9,846,228 B2 | 12/2017 | Davis et al. |
| 9,869,762 B1 | 1/2018 | Alland et al. |
| 1,009,219 A1 | 10/2018 | Lashkari et al. |
| 2001/0002919 A1 | 6/2001 | Sourour et al. |
| 2002/0004692 A1 | 1/2002 | Nicosia et al. |
| 2002/0044082 A1 | 4/2002 | Woodington et al. |
| 2002/0075178 A1 | 6/2002 | Woodington et al. |
| 2002/0118522 A1 | 8/2002 | Ho et al. |
| 2002/0130811 A1 | 9/2002 | Voigtlaender |
| 2002/0147534 A1 | 10/2002 | Delcheccolo et al. |
| 2002/0155811 A1 | 10/2002 | Prismantas |
| 2003/0001772 A1 | 1/2003 | Woodington et al. |
| 2003/0011519 A1 | 1/2003 | Breglia et al. |
| 2003/0058166 A1 | 3/2003 | Hirabe |
| 2003/0073463 A1 | 4/2003 | Shapira |
| 2003/0080713 A1 | 5/2003 | Kirmuss |
| 2003/0102997 A1 | 6/2003 | Levin et al. |
| 2003/0235244 A1 | 12/2003 | Pessoa et al. |
| 2004/0012516 A1 | 1/2004 | Schiffmann |
| 2004/0015529 A1 | 1/2004 | Tanrikulu et al. |
| 2004/0066323 A1 | 4/2004 | Richter |
| 2004/0070532 A1 | 4/2004 | Ishii et al. |
| 2004/0107030 A1 | 6/2004 | Nishira et al. |
| 2004/0138802 A1 | 7/2004 | Kuragaki et al. |
| 2004/0215373 A1 | 10/2004 | Won et al. |
| 2005/0008065 A1* | 1/2005 | Schilling ............... H04B 7/0891 375/148 |
| 2005/0069162 A1 | 3/2005 | Haykin |
| 2005/0090274 A1 | 4/2005 | Miyashita |
| 2005/0156780 A1* | 7/2005 | Bonthron ............... G01S 13/931 342/107 |
| 2005/0201457 A1 | 9/2005 | Allred et al. |
| 2005/0225476 A1 | 10/2005 | Hoetzel et al. |
| 2005/0273480 A1 | 12/2005 | Pugh et al. |
| 2006/0012511 A1 | 1/2006 | Dooi et al. |
| 2006/0036353 A1 | 2/2006 | Wintermantel |
| 2006/0050707 A1 | 3/2006 | Sterin |
| 2006/0093078 A1 | 5/2006 | Lewis et al. |
| 2006/0109170 A1 | 5/2006 | Voigtlaender et al. |
| 2006/0109931 A1 | 5/2006 | Asai |
| 2006/0114324 A1 | 6/2006 | Farmer et al. |
| 2006/0140249 A1 | 6/2006 | Kohno |
| 2006/0181448 A1 | 8/2006 | Natsume et al. |
| 2006/0220943 A1 | 10/2006 | Schlick et al. |
| 2006/0244653 A1 | 11/2006 | Szajnowski |
| 2006/0262007 A1 | 11/2006 | Bonthron |
| 2006/0262009 A1 | 11/2006 | Watanabe |
| 2007/0018884 A1 | 1/2007 | Adams |
| 2007/0018886 A1 | 1/2007 | Watanabe et al. |
| 2007/0096885 A1 | 5/2007 | Cheng et al. |
| 2007/0109175 A1 | 5/2007 | Fukuda |
| 2007/0115869 A1 | 5/2007 | Lakkis |
| 2007/0120731 A1 | 5/2007 | Kelly, Jr. et al. |
| 2007/0132633 A1 | 6/2007 | Uchino |
| 2007/0152870 A1 | 7/2007 | Woodington et al. |
| 2007/0152871 A1 | 7/2007 | Puglia |
| 2007/0152872 A1 | 7/2007 | Woodington |
| 2007/0164896 A1 | 7/2007 | Suzuki et al. |
| 2007/0171122 A1 | 7/2007 | Nakano |
| 2007/0182619 A1 | 8/2007 | Honda et al. |
| 2007/0182623 A1 | 8/2007 | Zeng |
| 2007/0188373 A1 | 8/2007 | Shirakawa et al. |
| 2007/0200747 A1 | 8/2007 | Okai |
| 2007/0263748 A1 | 11/2007 | Mesecher |
| 2007/0279303 A1 | 12/2007 | Schoebel |
| 2008/0088499 A1 | 4/2008 | Bonthron |
| 2008/0094274 A1 | 4/2008 | Nakanishi |
| 2008/0150790 A1 | 6/2008 | Voigtlaender et al. |
| 2008/0180311 A1 | 7/2008 | Mikami |
| 2008/0208472 A1 | 8/2008 | Morcom |
| 2008/0218406 A1 | 9/2008 | Nakanishi |
| 2008/0258964 A1 | 10/2008 | Schoeberl |
| 2008/0272955 A1 | 11/2008 | Yonak et al. |
| 2009/0003412 A1 | 1/2009 | Negoro et al. |
| 2009/0015459 A1 | 1/2009 | Mahler et al. |
| 2009/0015464 A1 | 1/2009 | Fukuda |
| 2009/0027257 A1 | 1/2009 | Arikan |
| 2009/0046000 A1 | 2/2009 | Matsuoka |
| 2009/0051581 A1 | 2/2009 | Hatono |
| 2009/0072957 A1 | 3/2009 | Wu et al. |
| 2009/0073025 A1* | 3/2009 | Inoue ............... G01S 13/325 342/70 |
| 2009/0074031 A1 | 3/2009 | Fukuda |
| 2009/0079617 A1 | 3/2009 | Shirakawa et al. |
| 2009/0085827 A1 | 4/2009 | Orime et al. |
| 2009/0103593 A1 | 4/2009 | Bergamo |
| 2009/0121918 A1 | 5/2009 | Shirai et al. |
| 2009/0212998 A1 | 8/2009 | Szajnowski |
| 2009/0237293 A1 | 9/2009 | Sakuma |
| 2009/0254260 A1 | 10/2009 | Nix et al. |
| 2009/0267822 A1 | 10/2009 | Shinoda et al. |
| 2009/0289831 A1 | 11/2009 | Akita |
| 2009/0295623 A1 | 12/2009 | Falk |
| 2010/0001897 A1 | 1/2010 | Lyman |
| 2010/0019950 A1 | 1/2010 | Yamano et al. |
| 2010/0039311 A1 | 2/2010 | Woodington et al. |
| 2010/0116365 A1 | 5/2010 | McCarty |
| 2010/0156690 A1 | 6/2010 | Kim et al. |
| 2010/0198513 A1 | 8/2010 | Zeng et al. |
| 2010/0253573 A1 | 10/2010 | Holzheimer et al. |
| 2010/0277359 A1 | 11/2010 | Ando |
| 2010/0289692 A1 | 11/2010 | Winkler |
| 2011/0006944 A1 | 1/2011 | Goldman |
| 2011/0032138 A1 | 2/2011 | Krapf |
| 2011/0074620 A1 | 3/2011 | Wintermantel |
| 2011/0187600 A1 | 8/2011 | Landt |
| 2011/0196568 A1 | 8/2011 | Nickolaou |
| 2011/0234448 A1 | 9/2011 | Hayase |
| 2011/0248796 A1 | 10/2011 | Pozgay |
| 2011/0279303 A1 | 11/2011 | Smith, Jr. et al. |
| 2011/0279307 A1 | 11/2011 | Song |
| 2011/0285576 A1 | 11/2011 | Lynam |
| 2011/0291874 A1 | 12/2011 | De Mersseman |
| 2011/0291875 A1 | 12/2011 | Szajnowski |
| 2011/0292971 A1 | 12/2011 | Hadani et al. |
| 2011/0298653 A1 | 12/2011 | Mizutani |
| 2012/0001791 A1 | 1/2012 | Wintermantel |
| 2012/0050093 A1 | 3/2012 | Heilmann et al. |

(56) References Cited

U.S. PATENT DOCUMENTS

| | | |
|---|---|---|
| 2012/0105268 A1 | 5/2012 | Smits et al. |
| 2012/0112957 A1 | 5/2012 | Nguyen et al. |
| 2012/0133547 A1 | 5/2012 | MacDonald et al. |
| 2012/0173246 A1 | 7/2012 | Choi et al. |
| 2012/0195349 A1 | 8/2012 | Lakkis |
| 2012/0249356 A1 | 10/2012 | Shope |
| 2012/0257643 A1 | 10/2012 | Wu et al. |
| 2012/0314799 A1 | 12/2012 | In De Betou et al. |
| 2012/0319900 A1 | 12/2012 | Johansson et al. |
| 2013/0016761 A1 | 1/2013 | Nentwig |
| 2013/0021196 A1 | 1/2013 | Himmelstoss |
| 2013/0027240 A1 | 1/2013 | Chowdhury |
| 2013/0057436 A1 | 3/2013 | Krasner et al. |
| 2013/0069818 A1 | 3/2013 | Shirakawa et al. |
| 2013/0102254 A1 | 4/2013 | Cyzs |
| 2013/0113647 A1 | 5/2013 | Sentelle et al. |
| 2013/0113652 A1 | 5/2013 | Smits et al. |
| 2013/0113653 A1 | 5/2013 | Kishigami et al. |
| 2013/0135140 A1 | 5/2013 | Kishigami |
| 2013/0169468 A1 | 7/2013 | Johnson et al. |
| 2013/0169485 A1 | 7/2013 | Lynch |
| 2013/0176154 A1 | 7/2013 | Bonaccio et al. |
| 2013/0214961 A1 | 8/2013 | Lee et al. |
| 2013/0229301 A1 | 9/2013 | Kanamoto |
| 2013/0244710 A1 | 9/2013 | Nguyen et al. |
| 2013/0249730 A1 | 9/2013 | Adcook |
| 2013/0314271 A1 | 11/2013 | Braswell et al. |
| 2013/0321196 A1 | 12/2013 | Binzer et al. |
| 2014/0022108 A1 | 1/2014 | Alberth, Jr. et al. |
| 2014/0028491 A1 | 1/2014 | Ferguson |
| 2014/0035774 A1 | 2/2014 | Khlifi |
| 2014/0070985 A1 | 3/2014 | Vacanti |
| 2014/0085128 A1* | 3/2014 | Kishigami ............ G01S 13/878 342/118 |
| 2014/0097987 A1 | 4/2014 | Worl et al. |
| 2014/0111367 A1 | 4/2014 | Kishigami et al. |
| 2014/0111372 A1 | 4/2014 | Wu |
| 2014/0139322 A1 | 5/2014 | Wang et al. |
| 2014/0159948 A1 | 6/2014 | Ishimori et al. |
| 2014/0220903 A1 | 8/2014 | Schulz et al. |
| 2014/0253345 A1 | 9/2014 | Breed |
| 2014/0253364 A1 | 9/2014 | Lee et al. |
| 2014/0285373 A1 | 9/2014 | Kuwahara et al. |
| 2014/0316261 A1 | 10/2014 | Lux et al. |
| 2014/0327566 A1 | 11/2014 | Burgio et al. |
| 2014/0340254 A1 | 11/2014 | Hesse |
| 2014/0348253 A1 | 11/2014 | Mobasher et al. |
| 2015/0002329 A1 | 1/2015 | Murad et al. |
| 2015/0002357 A1 | 1/2015 | Sanford et al. |
| 2015/0035662 A1 | 2/2015 | Bowers et al. |
| 2015/0061922 A1 | 3/2015 | Kishigami |
| 2015/0103745 A1 | 4/2015 | Negus et al. |
| 2015/0198709 A1 | 7/2015 | Inoue |
| 2015/0204966 A1 | 7/2015 | Kishigami |
| 2015/0204971 A1 | 7/2015 | Yoshimura et al. |
| 2015/0204972 A1 | 7/2015 | Kuehnle et al. |
| 2015/0226848 A1 | 8/2015 | Park |
| 2015/0234045 A1 | 8/2015 | Rosenblum |
| 2015/0247924 A1 | 9/2015 | Kishigami |
| 2015/0255867 A1 | 9/2015 | Inoue |
| 2015/0301172 A1 | 10/2015 | Ossowska |
| 2015/0323660 A1 | 11/2015 | Hampikian |
| 2015/0331090 A1 | 11/2015 | Jeong et al. |
| 2015/0369912 A1 | 12/2015 | Kishigami et al. |
| 2016/0003938 A1 | 1/2016 | Gazit et al. |
| 2016/0003939 A1 | 1/2016 | Stainvas Olshansky et al. |
| 2016/0018511 A1 | 1/2016 | Nayyar et al. |
| 2016/0033631 A1 | 2/2016 | Searcy et al. |
| 2016/0033632 A1 | 2/2016 | Searcy et al. |
| 2016/0041260 A1 | 2/2016 | Cao et al. |
| 2016/0054441 A1 | 2/2016 | Kuo et al. |
| 2016/0061935 A1 | 3/2016 | McCloskey et al. |
| 2016/0084941 A1 | 3/2016 | Arage |
| 2016/0084943 A1 | 3/2016 | Arage |
| 2016/0091595 A1 | 3/2016 | Alcalde |
| 2016/0103206 A1 | 4/2016 | Pavao-Moreira et al. |
| 2016/0124075 A1 | 5/2016 | Vogt et al. |
| 2016/0124086 A1 | 5/2016 | Jansen et al. |
| 2016/0131752 A1 | 5/2016 | Jansen et al. |
| 2016/0139254 A1 | 5/2016 | Wittenberg |
| 2016/0146931 A1* | 5/2016 | Rao ...................... H01Q 1/3233 342/59 |
| 2016/0154103 A1 | 6/2016 | Moriuchi |
| 2016/0178732 A1 | 6/2016 | Oka et al. |
| 2016/0213258 A1* | 7/2016 | Lashkari ............. G01S 15/8927 |
| 2016/0238694 A1 | 8/2016 | Kishigami |
| 2016/0349365 A1 | 12/2016 | Ling |
| 2017/0010361 A1 | 1/2017 | Tanaka |
| 2017/0023661 A1 | 1/2017 | Richert |
| 2017/0023663 A1 | 1/2017 | Subburaj et al. |
| 2017/0074980 A1 | 3/2017 | Adib |
| 2017/0090015 A1* | 3/2017 | Breen ...................... G01S 7/032 |
| 2017/0117950 A1 | 4/2017 | Strong |
| 2017/0153316 A1 | 6/2017 | Wintermantel |
| 2017/0219689 A1 | 8/2017 | Hung et al. |
| 2017/0234968 A1 | 8/2017 | Roger et al. |
| 2017/0293025 A1 | 10/2017 | Davis et al. |
| 2017/0293027 A1 | 10/2017 | Stark et al. |
| 2017/0307728 A1 | 10/2017 | Eshraghi et al. |
| 2017/0309997 A1 | 10/2017 | Alland et al. |
| 2017/0310758 A1 | 10/2017 | Davis et al. |
| 2017/0336495 A1 | 11/2017 | Davis et al. |
| 2018/0175907 A1 | 1/2018 | Marr |

FOREIGN PATENT DOCUMENTS

| | | |
|---|---|---|
| EP | 2821808 | 7/2015 |
| FR | 2751086 | 1/1998 |
| WO | WO2015175078 | 11/2015 |
| WO | WO2015185058 | 12/2015 |
| WO | WO2016011407 | 1/2016 |
| WO | WO2016030656 | 3/2016 |
| WO | WO2017175190 | 10/2017 |
| WO | WO2017187330 | 11/2017 |

OTHER PUBLICATIONS

Fraser, "Design and simulation of a coded sequence ground penetrating radar," In: Diss. University of British Columbia, Dec. 3, 2015.

Zhou et al., "Linear extractors for extracting randomness from noisy sources," In: Information Theory Proceedings (ISIT), 2011 IEEE International Symposium on Oct. 3, 2011.

V. Giannini et al., "A 79 GHz Phase-Modulated 4 GHz-BW CW Radar Transmitter in 28 nm CMOS,"in IEEE Journal of Solid-State Circuits, vol. 49, No. 12, pp. 2925-2937, Dec. 2014. (Year: 2014).

Oscar Faus Garcia, " Signal Processing for mm Wave MIMO Radar," University of Gavle, Faculty of Engineering and Sustainable Development, Jun. 2015; Retrieved from the Internet from http://www.diva-portal.se/smash/get/diva2:826028/FULLTEXT01.pdf.

International Search Report of the International Searching Authority from corresponding Patent Cooperation Treaty (PCT) Application No. PCT/IB18/50819, indicated completed on May 23, 2018.

Written Opinion of the International Searching Authority from corresponding Patent Cooperation Treaty (PCT) Application No. PCT/IB18/50819, indicated completed on May 23, 2018.

\* cited by examiner

PROGRAMMABLE CODE GENERATION FOR RADAR SENSING SYSTEMS

CROSS REFERENCE TO RELATED APPLICATIONS

This application is a continuation of U.S. patent application Ser. No. 15/892,865, filed Feb. 9, 2018, now U.S. Pat. No. 10,670,695, which claims the filing benefits of U.S. provisional application, Ser. No. 62/457,394, filed Feb. 10, 2017, which are both hereby incorporated by reference herein in their entireties.

FIELD OF THE INVENTION

The present invention is directed to radar systems, and in particular to radar systems for vehicles.

BACKGROUND OF THE INVENTION

The use of radar to determine range, velocity, and angle (elevation or azimuth) of objects in an environment is important in a number of applications including automotive radar and gesture detection. Radar systems typically transmit a radio frequency (RF) signal and listen for the reflection of the radio signal from objects in the environment. A radar system estimates the location of objects, also called targets, in the environment by correlating delayed versions of the received radio signal with the transmitted radio signal. A radar system can also estimate the velocity of the target by Doppler processing. A radar system with multiple transmitters and multiple receivers can also determine the angular position of a target.

A radar system consists of transmitters and receivers. The transmitters generate a baseband signal which is up converted to a radio frequency (RF) signal that propagates according to an antenna pattern. The transmitted signal is reflected off of object or targets in the environment. The received signal at each receiver is the totality of the reflected signal from all targets in the environment. The receiver down converts the received signal to baseband and compares the baseband received signal to the baseband signal at one or more transmitters. This is used to determine the range, velocity and angle of targets in the environment.

SUMMARY OF THE INVENTION

Embodiments of the present invention provide methods and an apparatus to improve the performance of a radar system. An exemplary radar system is configured to provide sequences of spreading code chips to digital signal generators of each transmitter and to digital baseband processing sections of each receiver. A programmable code generator unit is communicatively coupled to each of the transmitters and receivers and is configured to provide the sequences of spreading code chips. The programmable code generator provides one spreading sequence consisting of spreading code chips to each transmitter while multiple spreading codes are supplied to each receiver, such that a digital signal generator and a corresponding digital baseband processing section of a first transmitter and each receiver will each be supplied the same spreading code used by the transmitter and each receiver to generate transmitted radio signals and to process received radio signals, respectively.

A radar sensing system for a vehicle in accordance with an embodiment of the present invention includes a plurality of transmitters, a plurality of receivers, and a programmable code generation unit. The plurality of transmitters is configured for installation and use on a vehicle and is configured to transmit radio signals. The plurality of receivers is configured for installation and use on the vehicle, and is configured to receive radio signals that include the transmitted radio signals transmitted by the transmitters and reflected from objects in an environment. The programmable code generation unit is configured to provide sequences of spreading code chips to digital signal generators of the transmitters and to digital baseband processing sections of the receivers. Particular sequences of spreading code chips are provided to individual transmitters. A particular sequence of spreading code chips is used by a digital signal generator as part of the process to generate transmitted radio signals. Multiple sequences of spreading code chips are used by a digital baseband processing section of a receiver to process received radio signals.

A method for controlling a radar sensing system comprising a plurality of transmitters configured for installation and use on a vehicle, a plurality of receivers configured for installation and use on the vehicle, and a programmable code generation unit configured for installation and use on the vehicle. The method includes transmitting, with the transmitters, radio signals and receiving, with the receivers, radio signals that include the transmitted radio signals transmitted by the transmitters and reflected from objects in an environment. A radio frequency (RF) front end of a first receiver is used to process the received radio signals and output processed radio signals. An analog-to-digital converter (ADC) of the first receiver is used to sample the processed radio signals and output data samples. The method further includes generating, with the programmable code generation unit, spreading sequences used by digital signal generators of the transmitters to generate transmitted radio signals and used by digital baseband processing sections of the receivers to process received radio signals.

In an aspect of the present invention, the programmable code generation unit may be configured to generate a plurality of different spreading codes and/or a plurality of maximum length sequences.

In another aspect of the present invention, the programmable code generation unit may be configured to generate a plurality of codes from one of a Hadamard code, a Golay code, a Frank-Zadoff-Chu code, and an APAS code.

In yet a further aspect of the present invention, the programmable code generation unit may include a control processor and a plurality of feedback shift registers. The shift register feedback connections and shift register contents of the feedback shift registers are defined by the control processor. The programmable code generation unit also includes logic that alters the output of the feedback shift registers in order to alter properties of the sequences produced by the feedback shift registers. The plurality of feedback shift registers may be loaded with any seed contents, as defined by the control processor. The plurality of feedback shift registers may also be further configured with any set of feedback connections, as defined by the control processor. The shift register sequences may be altered to provide DC balance within a sequence of a transmitter and/or across the sequences for different transmitters.

These and other objects, advantages, purposes and features of the present invention will become apparent upon review of the following specification in conjunction with the drawings.

DESCRIPTION OF THE PREFERRED EMBODIMENTS

The present invention will now be described with reference to the accompanying figures, wherein numbered elements in the following written description correspond to like-numbered elements in the figures. Methods and systems of the present invention provide for a programmable code generation unit configured to generate sequences to be received by both transmitters and receivers of a radar system and used to generate transmitted signals as well as used to process received signals. An exemplary programmable code generation unit comprises a control processor and a plurality of feedback shift registers. The control processor configures shift register feedback connections and selects contents (seeds) of the feedback shift registers in order to alter properties of the sequences that are generated by the feedback shift registers.

Figure 1:
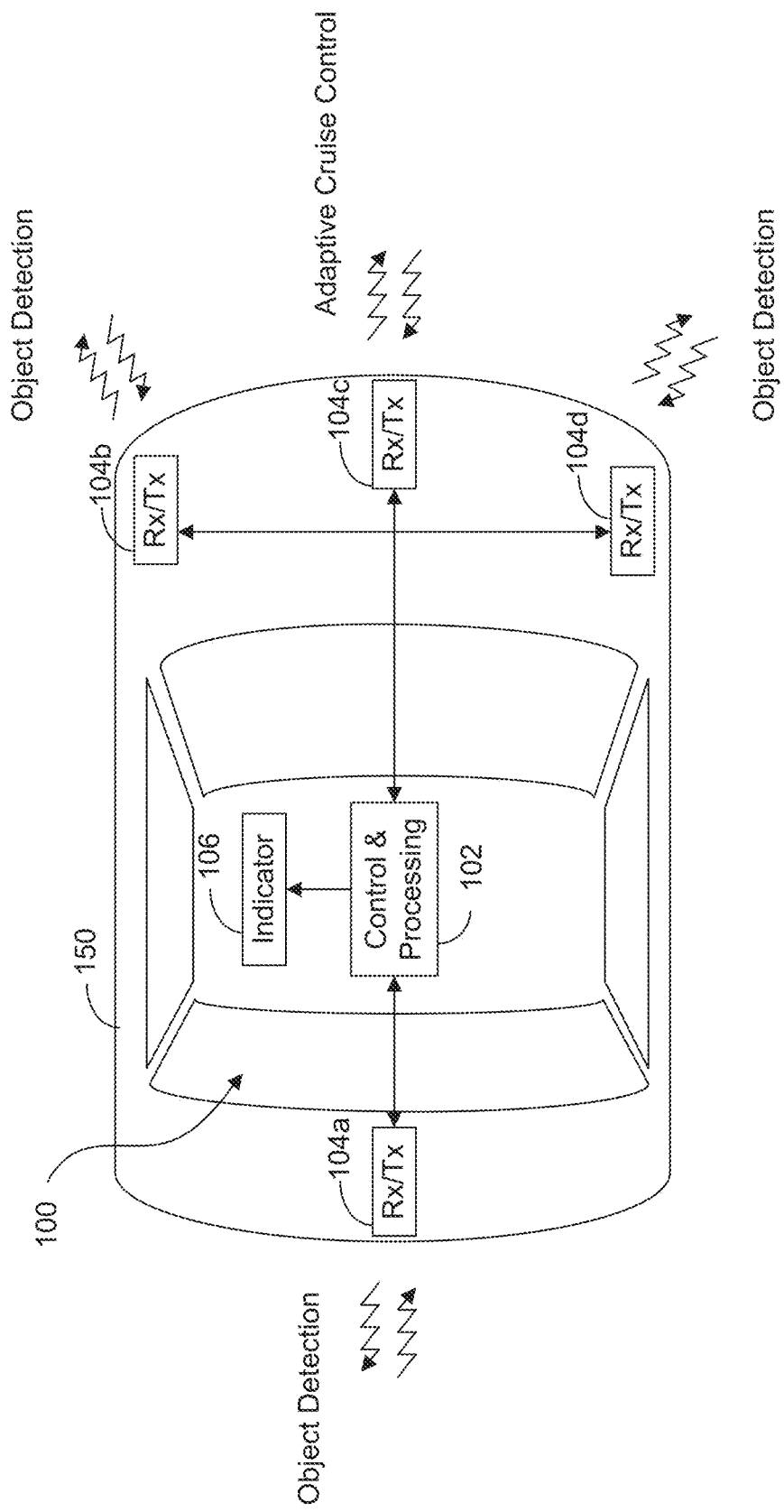
FIG. 1 is a plan view of an automobile equipped with a radar system in accordance with the present invention.

FIG. 1. Illustrates an exemplary radar system 100 configured for use in a vehicle 150. In an aspect of the present invention, a vehicle 150 may be an automobile, truck, or bus, etc. The radar system 100 may utilize multiple radar systems (e.g., 104a-104d) embedded in the vehicle 150 (see FIG. 1). Each of these radar systems may employ multiple transmitters, receivers, and antennas (see FIG. 3). These signals are reflected from objects (also known as targets) in the environment and received by one or more receivers of the radar system. A transmitter-receiver pair is called a virtual radar (or sometimes a virtual receiver). As illustrated in FIG. 1, the radar system 100 may comprise one or more transmitters and one or more receivers (104a-104d) for a plurality of virtual radars. Other configurations are also possible. FIG. 1 illustrates the receivers/transmitters 104a-104d placed to acquire and provide data for object detection and adaptive cruise control. As illustrated in FIG. 1, a controller 102 receives and the analyzes position information received from the receivers 104a-104d and forwards processed information (e.g., position information) to, for example, an indicator 106 or other similar devices, as well as to other automotive systems. The radar system 100 (providing such object detection and adaptive cruise control or the like) may be part of an Advanced Driver Assistance System (ADAS) for the automobile 150.

An exemplary radar system operates by transmitting one or more signals from one or more transmitters and then listening for reflections of those signals from objects in the environment by one or more receivers. By comparing the transmitted signals and the received signals, estimates of the range, velocity, and angle (azimuth and/or elevation) of the objects can be estimated.

Figure 2A:
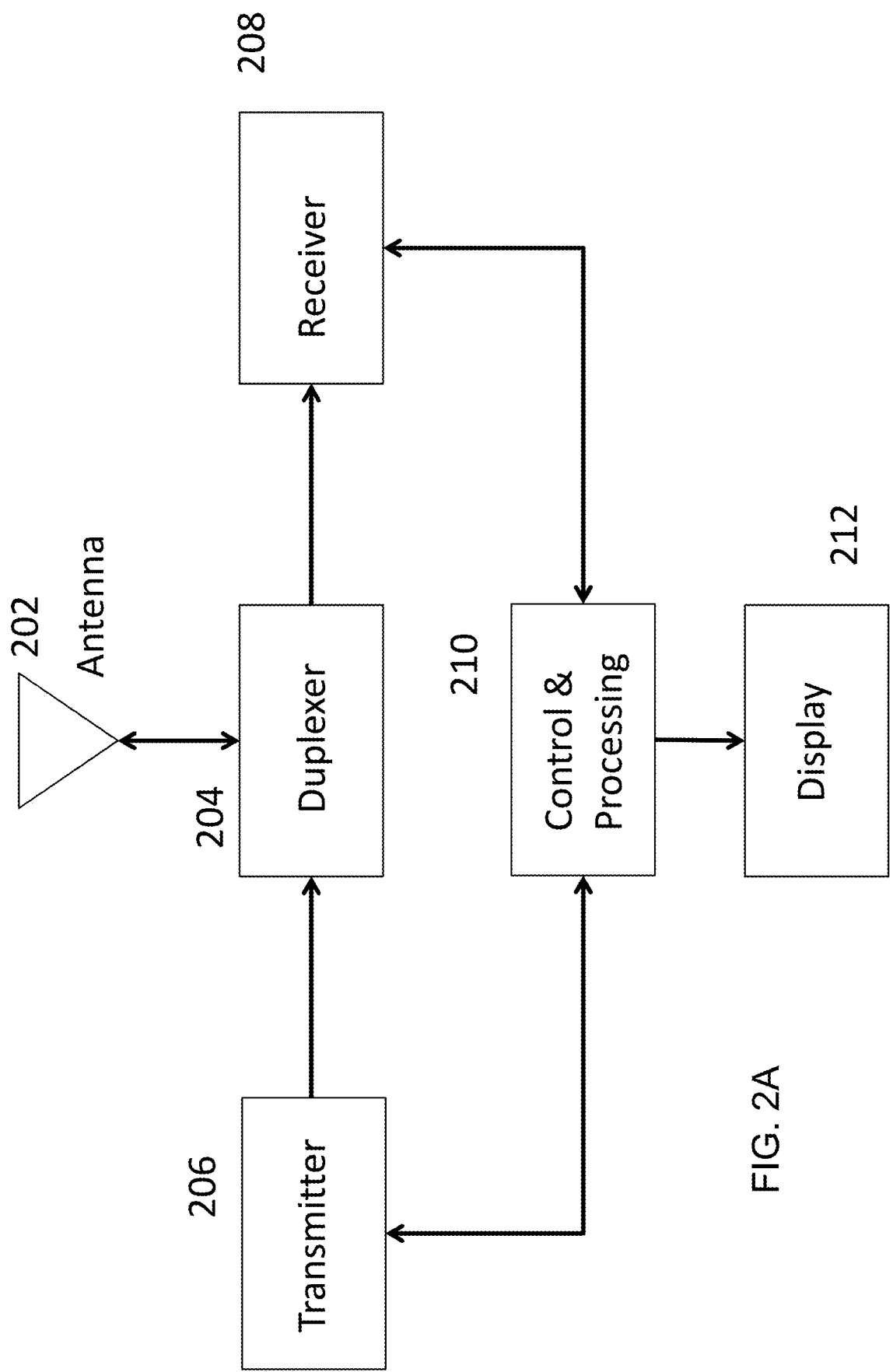
FIG. 2A and FIG. 2B are block diagrams of radar systems in accordance with the present invention.
Figure 2B:
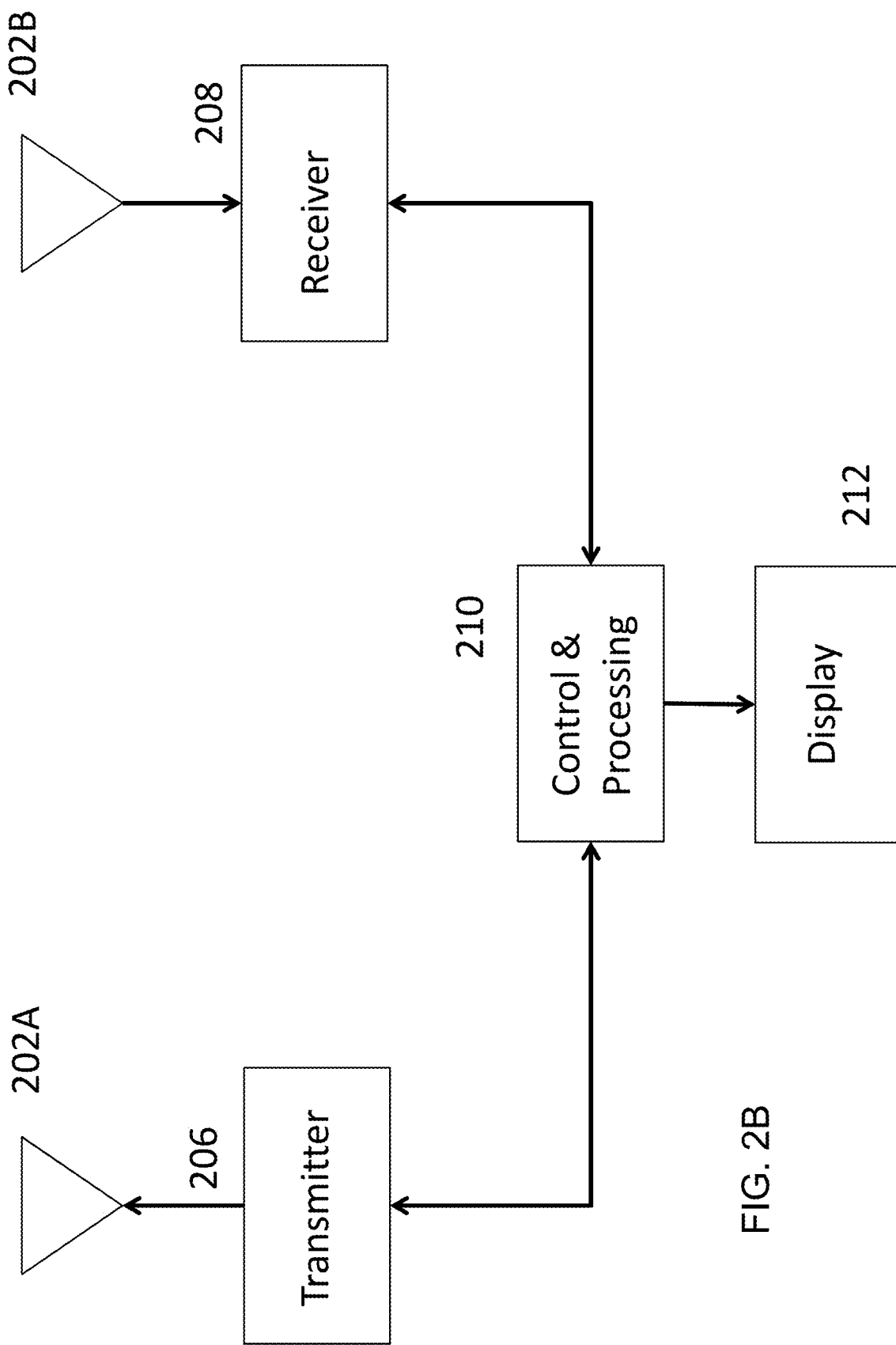

There are several ways to implement a radar system. One way, illustrated in FIG. 2A, uses a single antenna 202 for transmitting and receiving. The antenna 202 is connected to a duplexer 204 that routes the appropriate signal from the antenna 202 to a receiver 208 or routes the signal from a transmitter 206 to the antenna 202. A control processor 210 controls the operation of the transmitter 206 and the receiver 208 and estimates the range and velocity of objects in the environment. A second way to implement a radar system is shown in FIG. 2B. In this system, there are separate antennas for transmitting (202A) and receiving (202B). A control processor 210 performs the same basic functions as in FIG. 2A. In each case, there may be a display 212 to visualize the location of objects in the environment.

Figure 3:
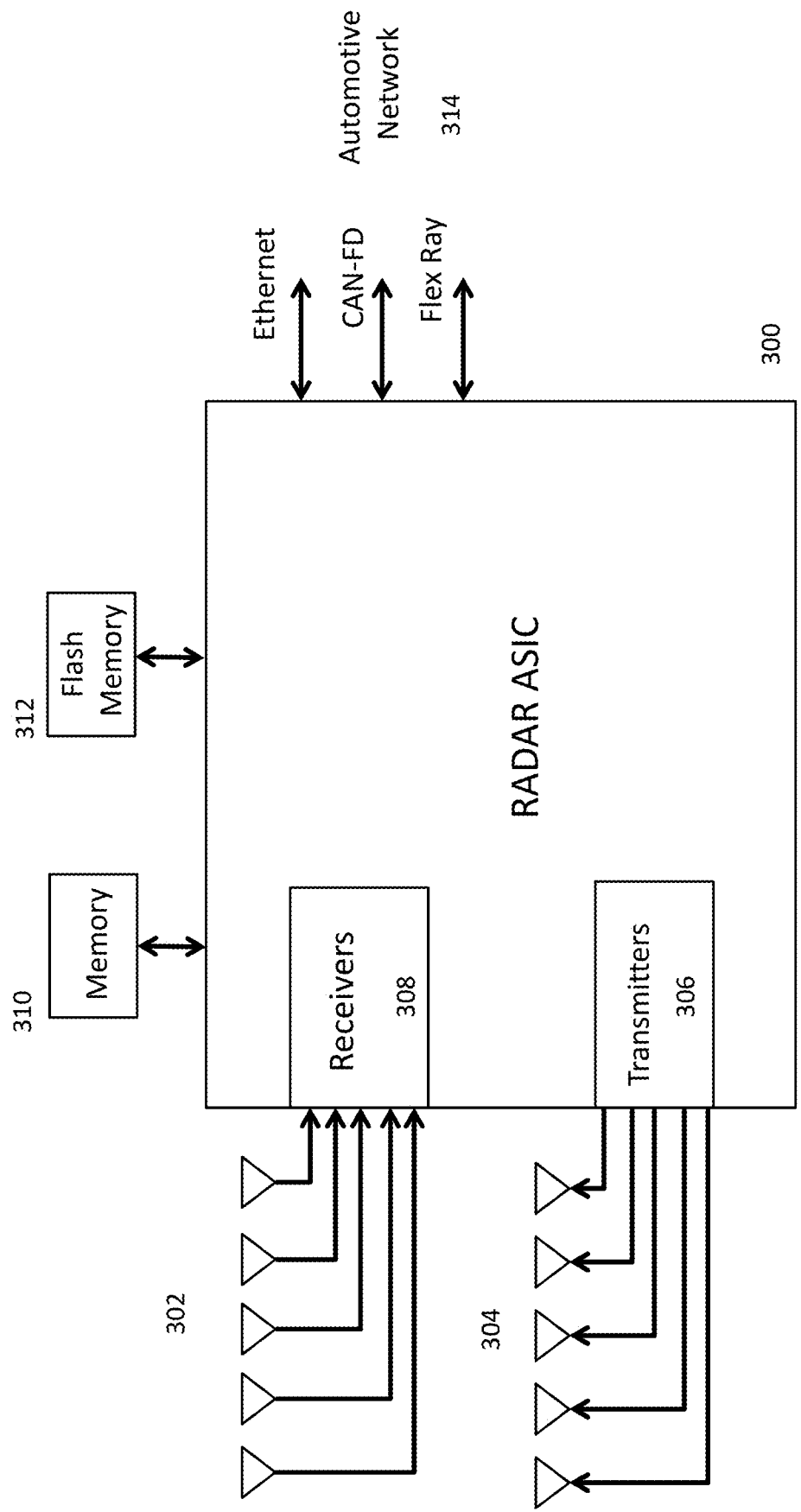
FIG. 3 is a block diagram illustrating a radar system with a plurality of receivers and a plurality of transmitters in accordance with the present invention.

A radar system with multiple antennas, transmitters and receivers is shown in FIG. 3. Using multiple antennas 302, 304 allows an exemplary radar system 300 to determine the angle (azimuth or elevation or both) of targets in the environment. Depending on the geometry of the antenna system different angles (e.g., azimuth or elevation) can be determined.

The radar system 300 may be connected to a network via an Ethernet connection or other types of network connections 314, such as, for example, CAN-FD and FlexRay. The radar system 300 may also have memory (310, 312) to store software used for processing the signals in order to determine range, velocity and location of objects. Memory 310, 312 may also be used to store information about targets in the environment. There may also be processing capability contained in the ASIC 208 apart from the transmitters 203 and receivers 204.

The description herein includes an exemplary radar system in which there are NT transmitters and NR receivers for NT×NR virtual radars, one for each transmitter-receiver pair. For example, a radar system with eight transmitters and eight receivers will have 64 pairs or 64 virtual radars (with 64 virtual receivers). When three transmitters (Tx1, Tx2, Tx3) generate signals that are being received by three receivers (Rx1, Rx2, Rx3), each of the receivers is receiving the transmission from each of the transmitters reflected by objects in the environment. Each receiver can attempt to determine the range and Doppler of objects by correlating with delayed replicas of the signal from each of the transmitters. The physical receivers may then be "divided" into three separate virtual receivers, each virtual receiver correlating with delay replicas of one of the transmitted signals.

There are several different types of signals that transmitters in radar systems employ. A radar system may transmit a pulsed signal or a continuous signal. In a pulsed radar system, the signal is transmitted for a short time and then no signal is transmitted. This is repeated over and over. When the signal is not being transmitted, the receiver listens for echoes or reflections from objects in the environment. Often a single antenna is used for both the transmitter and receiver and the radar transmits on the antenna and then listens to the received signal on the same antenna. This process is then repeated. In a continuous wave radar system, the signal is continuously transmitted. There may be an antenna for transmitting and a separate antenna for receiving.

Another classification of radar systems is the modulation of signal being transmitted. A first type of continuous wave radar signal is known as a frequency modulated continuous wave (FMCW) radar signal. In an FMCW radar system, the transmitted signal is a sinusoidal signal with a varying frequency. By measuring a time difference between when a certain frequency was transmitted and when the received signal contained that frequency, the range to an object can be determined. By measuring several different time differences between a transmitted signal and a received signal, velocity information can be obtained.

A second type of continuous wave signal used in radar systems is known as a phase modulated continuous wave (PMCW) radar signal. In a PMCW radar system, the transmitted signal from a single transmitter is a sinusoidal signal in which the phase of the sinusoidal signal varies. Typically, the phase during a given time period (called a chip period or chip duration) is one of a finite number of possible phases. A spreading code consisting of a sequence of chips, (e.g., +1, +1, −1, +1, −1 . . . ) is mapped (e.g., +1→0, −1→π) into a sequence of phases (e.g., 0, 0, π, 0, π . . . ) that is used to modulate a carrier to generate the radio frequency (RF) signal. The spreading code could be a periodic sequence or could be a pseudo-random sequence with a very large period so it appears to be a nearly random sequence. The spreading code could be a binary code (e.g., +1 or −1). The resulting signal has a bandwidth that is proportional to the rate at which the phases change, called the chip rate $R_c$, which is the inverse of the chip duration $T_c=1/R_c$. By comparing the return signal to the transmitted signal, the receiver can determine the range and the velocity of reflected objects.

In some radar systems, the signal (e.g. a PMCW signal) is transmitted over a short time period (e.g. 1 microsecond) and then turned off for a similar time period. The receiver is only turned on during the time period where the transmitter is turned off. In this approach, reflections of the transmitted signal from very close targets will not be completely available because the receiver is not active during a large fraction of the time when the reflected signals are being received. This is called pulse mode.

The radar sensing system of the present invention may utilize aspects of the radar systems described in U.S. Pat. Nos. 9,846,228; 9,806,914; 9,791,564; 9,791,551; 9,772,397; 9,753,121; 9,599,702; 9,575,160 and/or 9,689,967, and/or U.S. Publication Nos. US-2017-0309997; US-2017-0307728 and/or US-2017-0310758, and/or U.S. patent application Ser. No. 15/496,038, filed Apr. 25, 2017, Ser. No. 15/689,273, filed Aug. 29, 2017, and/or Ser. No. 15/705,627, filed Sep. 15, 2017, and/or U.S. provisional applications, Ser. No. 62/486,732, filed Apr. 18, 2017, Ser. No. 62/528,789, filed Jul. 5, 2017, Ser. No. 62/573,880, filed Oct. 18, 2017, Ser. No. 62/598,563, filed Dec. 14, 2017, and/or Ser. No. 62/623,092, filed Jan. 29, 2018, which are all hereby incorporated by reference herein in their entireties.

Figure 4:
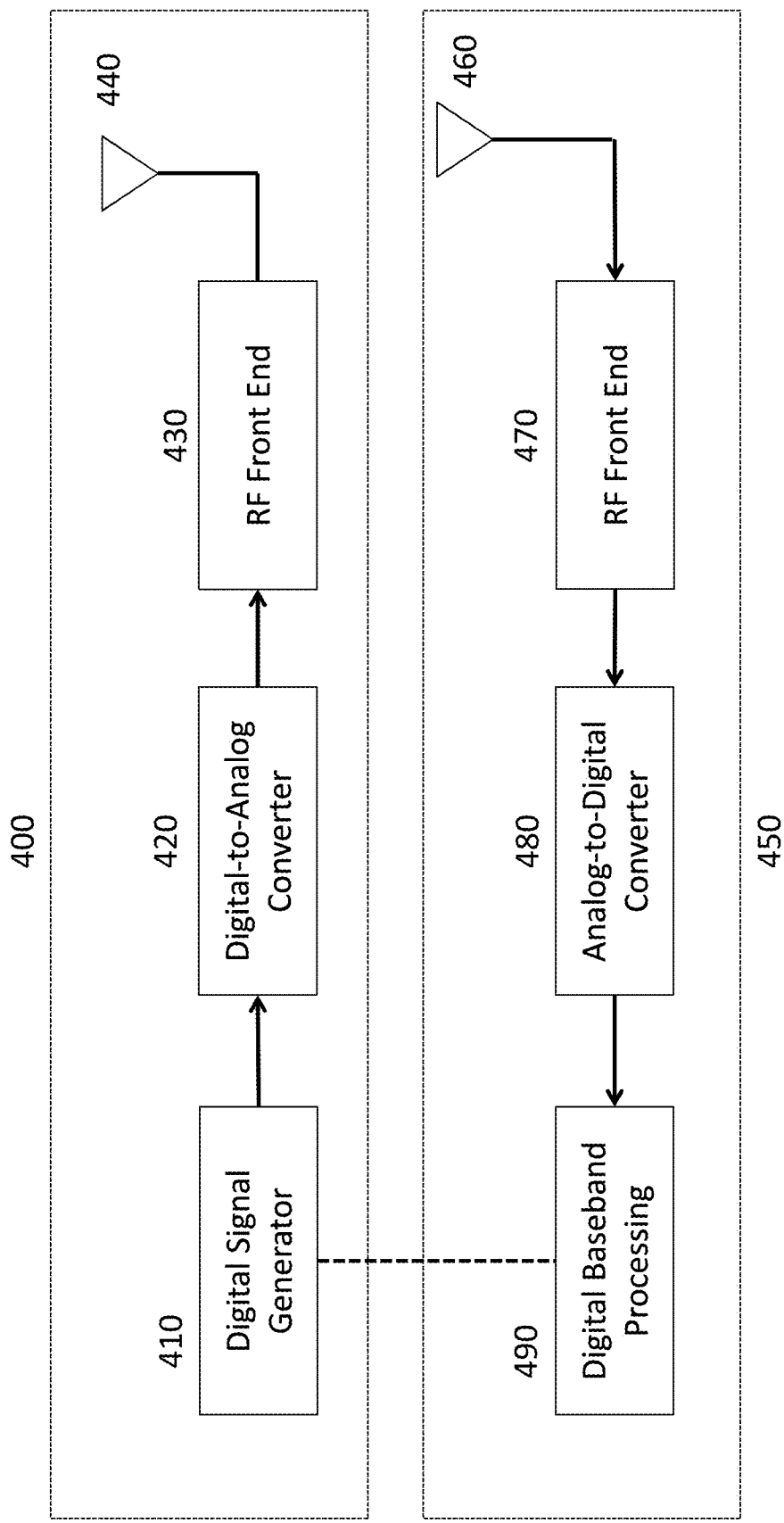
FIG. 4 is a block diagram of an exemplary receive pipeline and transmit pipeline for a radar system in accordance with the present invention.

FIG. 4 illustrates an exemplary transmitter 400 and receiver 450 of a radar system. The transmitter 400 includes a digital processor 410 that generates a baseband transmitted signal. The baseband signal is converted to an analog signal by a digital-to-analog converter (DAC) 420 and then mixed up to a carrier frequency and amplified by a radio frequency (RF) front end 430 before being radiated by an antenna 440. Each receiver 450 of the radar system generally will have a receive antenna 460, an analog RF front end 470 followed by an analog-to-digital converter (ADC) 480 that outputs complex valued digitized samples (i.e., values comprising a mathematical real component and a mathematical imaginary component) and a digital baseband processing section 490. The digital signal generator 410 (of the transmitter 400) and the digital baseband processing section 490 (of the receiver 450) need to know the sequence of spreading code chips used in generating the spreading code (e.g., for successful correlation of the received radio signals). This shared knowledge of the sequence of spreading code chips is illustrated with the dashed line connecting (410) and (490).

Figure 5:
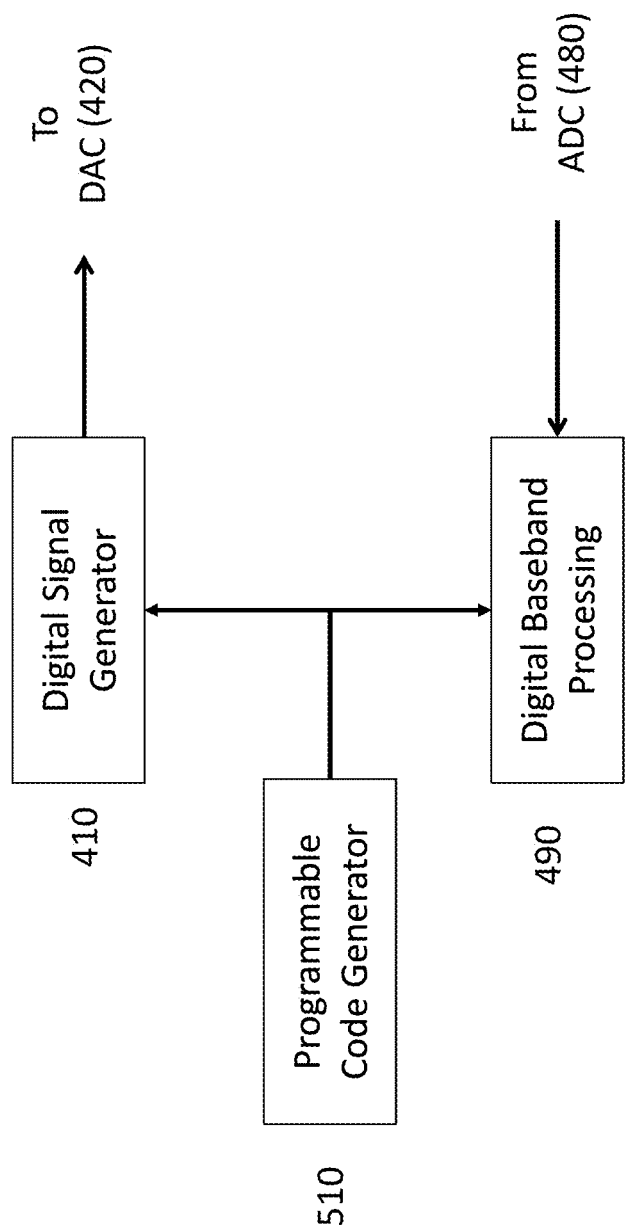
FIG. 5 is a block diagram of an exemplary digital processing section of the transmitters and receivers with a common programmable code generator unit in accordance with the present invention.

FIG. 5 illustrates a block diagram of the digital processing sections of the transmitter (410) and receiver (490) that includes an exemplary programmable code generation unit 510 that is communicatively coupled to each. Note that while FIG. 5 illustrates a single digital processing section 410 for the transmitter 400, there may be a plurality of digital processing sections 410 from a plurality of transmitters 400. Similarly, there can be a plurality of digital baseband processing sections 490 from a plurality of receivers 450. However, there is only one programmable code generation unit 510 used to generate all the spreading codes for the different transmitters 400 and used by the different receivers 450.

The digital baseband processing section 490 of a receiver 450 in a radar system will processes samples from the ADC 480. This processing involves calculating correlations with different delays of the baseband signal for each of the possible transmitted baseband signals. There are a variety of ways that the correlation process can be accomplished, including the use of a matched filter and Fourier transform processing. The processing for calculating correlations can be done for a set of distances. Each delay of the baseband signal corresponds to a range for a target. A range bin is the range corresponding to a certain delay of the baseband signal used in a correlation. The correlation with a particular delay is an indication of whether or not a target is present at the particular range. For example, a spreading code might have a chip rate of $R_c$=500 Mchips/second which would correspond to a chip duration of $T_c$=2 nanoseconds (ns). The receiver 450 might perform correlation delays at intervals of 2 ns, starting at a delay of 2 ns up to a maximum delay of 256 ns. That is, 128 different correlations would be performed. A target at a distance of 30 meters would produce a delay of 200 ns. A correlation with a baseband spreading code at a delay of 100 chips (200 ns) would produce a large magnitude output because the reflected signal off the target at 30 meters would produce a large correlation with the baseband spreading signal also delayed by 200 ns. While a target at a distance of 30.3 meters would produce a large correlation with a baseband signal delayed by 101 chips (202 ns). Therefore, targets at a distance between close to 30 meters (e.g. within ±0.15 meters would produce larger outputs when correlated with a baseband signal delay by 100 chips than a baseband signal delayed by either 99 chips or 101 chips. The range bin then corresponding to 30 meters would be of a width of 0.3 meters. A correlation unit might be set up to produce a certain set of correlations (e.g. 128 correlations for range bins starting at 0.3 meters to a distance of 38.4 meters). In other words, a correlation unit might be capable of producing a certain number of correlations or determine the presence of targets in a certain set of range bins. A correlation unit could be set up to consider different sets of range bins with which to perform correlations over.

Figure 6:
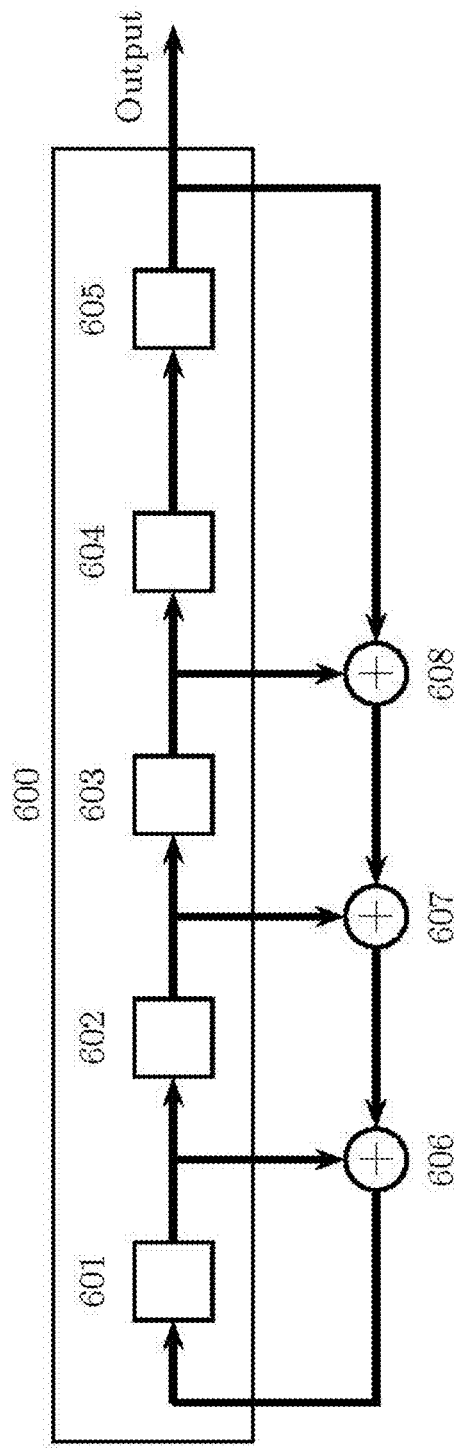
FIG. 6 is a diagram showing a Fibonacci implementation of an m-sequence generator in accordance with the present invention.

Spreading codes with good autocorrelation functions are important so that the receiver can distinguish targets from different locations. Sometimes the spreading codes are called sequences and sometimes they are called codes. One type of spreading code is known as a maximal-length sequence or an m-sequence for short. This is also called a linear feedback shift register (LFSR) sequence. This might also be known as a pseudo-noise (PN) sequence. Therefore, such a generator may be known as a pseudo-random sequence generator (PRBS). FIG. 6 illustrates an exemplary shift register 600 used to generate an m-sequence. FIG. 6 illustrates that there are a number of memory elements 601-605 that form the shift register 600. The exemplary shift register 600 may have any number of elements and adders and is not limited to the number of elements and adders, or their arrangement, illustrated in FIG. 6. Each memory element 601-605 stores a binary value 0 or 1. The shift register has a clock signal (not shown) in which at every clock cycle the contents of the memory elements 601-605 are shifted to the right and a linear combination (606-608) of the elements are used to generate a bit stored in the left most element (601). The adders (606-608) are binary modulo two adders. That is, 0+0=0, 0+1=1, and 1+1=0.

The sequence of output of the far-right element (605) is the m-sequence. This sequence has a number of properties. The generated sequence, $x_n$, is a periodic sequence. This is because there are a finite number of possible contents (states) of the shift register 600. Every time the shift register 600 is in a certain state, the sequence of states subsequently is identical. If the shift register 600 is ever in an all-zero state (where every element contains the binary value 0) then the shift register 600 will remain in the all zero state and the output will be a binary value 0 always. If there are m elements in the shift register 600, then it is possible for the state to be one of $2^m$ possible values. However, as indicated above, the all zero state produces a trivial sequence of all zeros. There are $2^m-1$ possible nonzero states. If the shift register 600 goes through all these states before repeating, then the sequence will repeat with period $L_c=2^m-1$. This sequence is known as a maximal length sequence because it is the maximum length sequence that can be produced by a shift register 600 of length m. The method to generate the sequence, illustrated in FIG. 6, is known as the Fibonacci implementation. Another implementation of the same spreading code is illustrated in FIG. 7, and is known as the Galois implementation.

Figure 7:
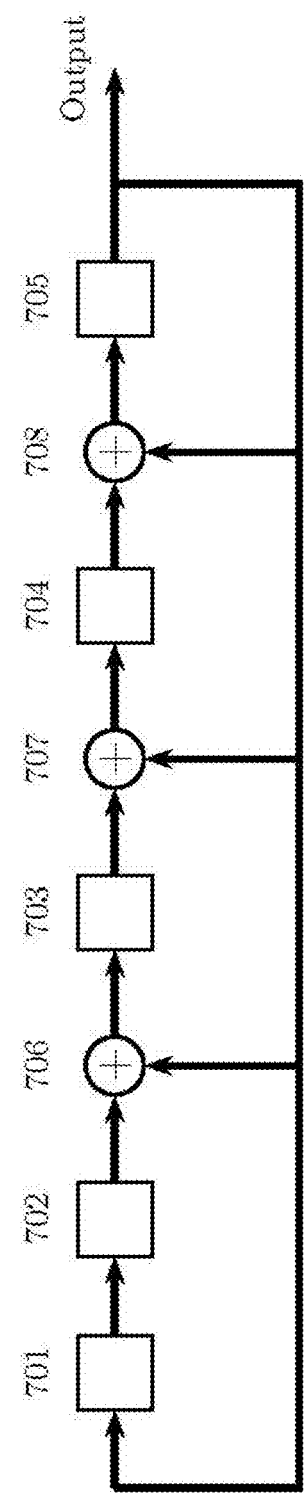
FIG. 7 is a diagram showing a Galois implementation of an m-sequence generator in accordance with the present invention.

In FIG. 7, modulo two adders (706-708) are positioned between certain memory elements (701-705). The sequences generated by the two implementations are the same, provided that the connections for the Galois implementation are the reverse of the connections shown for the Fibonacci implementation. Only certain feedback connections used in the shift register will generate maximal length sequences. Other feedback connections will generate sequences of length that are smaller than the maximum length that is generated by an m-sequence generator. The appropriate feedback connections are widely tabulated for shift registers of moderate size (e.g. m<30).

Figure 8:
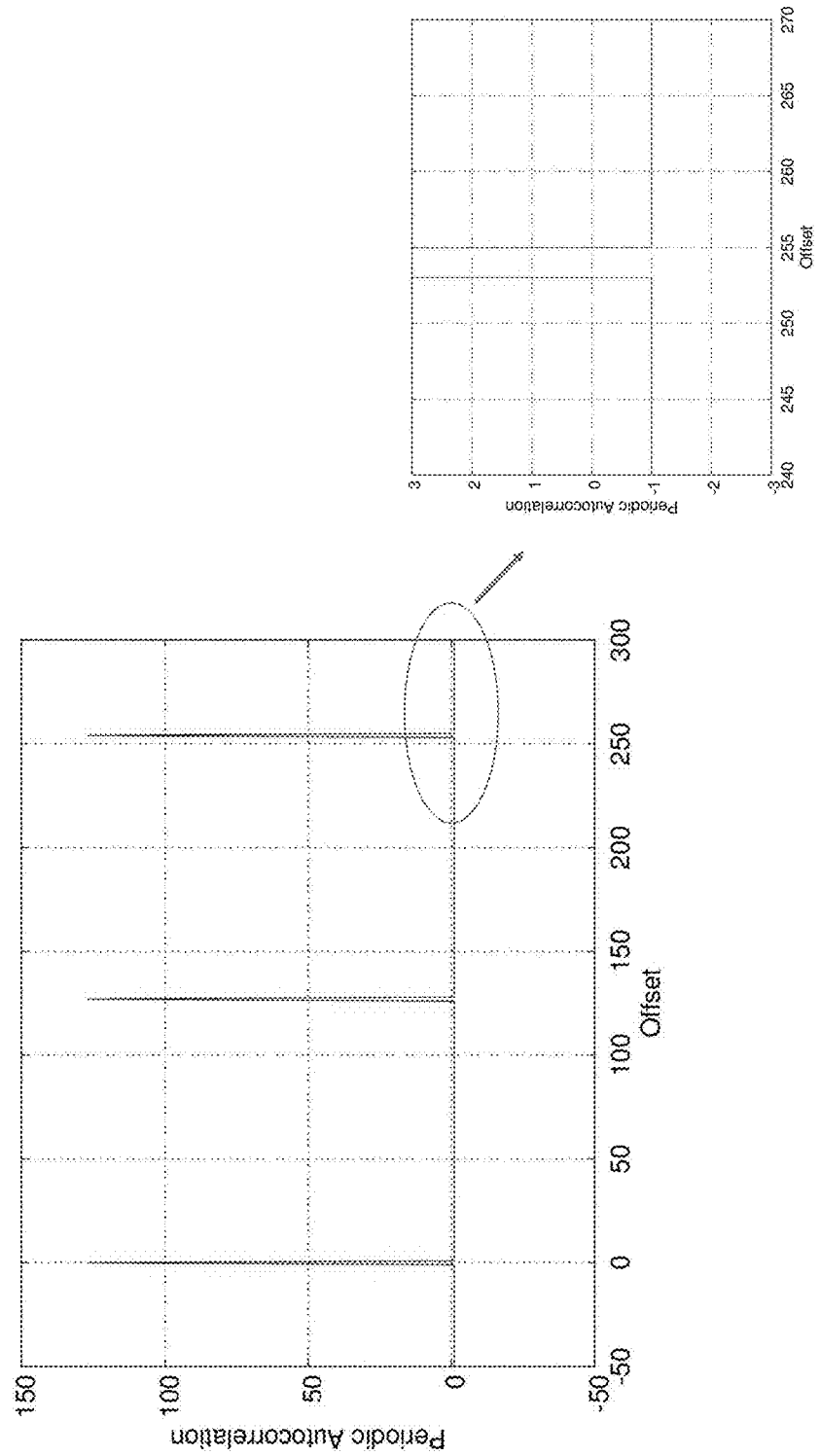
FIG. 8 is a plot of a periodic autocorrelation function of an m-sequence of length 127 in accordance with the present invention.

Often, the sequence of 1s and 0s is converted to a binary sequence of +1's and −1s. There are two possible mappings, either 0→+1, 1→−1 or 0→−1, 1→+1. If the former is used, then adding modulo 2 in the 0, 1 domain is the same as multiplication in the +1, −1 domain. If the sequence generated consisting of 1s and 0s is converted to +1 s and −1s and called $u_n$, n=0, 1, 2, . . . , then the periodic autocorrelation of the sequence $u_n$ has a two-level property. The periodic autocorrelation of the sequence $u_n$ is:

$$\theta_u(l) = \sum_{n=0}^{L_c} u_n u_{n+l}^*$$

where either the sequence is an infinite length periodic sequence with period $L_c$ or the index on $u_{n+l}$ is determined modulo $L_c$. The autocorrelation function is the correlation between the sequence $u_n$ and the same sequence with offset l, namely $u_{n+l}$. Note that in the case where the sequence contains complex numbers, $u_n^*$ is the complex conjugate of $u_n$. The periodic autocorrelation $\theta_u(l)$ of an m-sequence (converted to a +1, −1 sequence) is $L_c$ (mod $L_c$), if =0 and $\theta_u(l)=-1$, if l(mod $L_c$)=1, 2, . . . , N-1. This is illustrated in FIG. 8 for an m-sequence of length/period $L_c$=127, including a zoomed-in portion which shows that when l≠0 mod ($L_c$), the autocorrelation is −1.

Another autocorrelation function is the aperiodic autocorrelation function. This is defined as $$C_x(l) = \sum_{n=0}^{L_c-1-l} u_n u_{n+l}^*, \text{ for } 0 \le l \le L_c - 1$$

and $$C_x(l) = \sum_{n=0}^{L_c-1+l} u_{n-l} u_n^*, \text{ for } 1 - L_c \le l \le -1.$$

Figure 9:
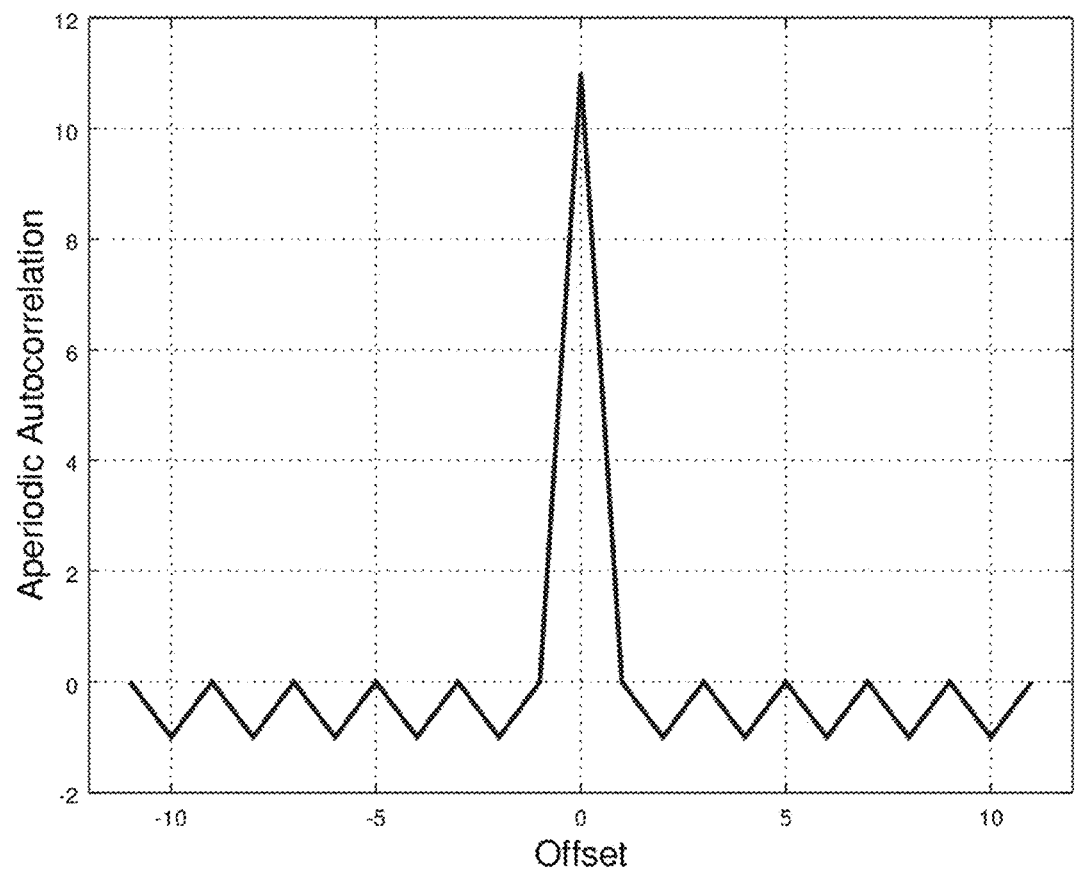
FIG. 9 is a plot of an aperiodic autocorrelation function of a Barker code of length 11 in accordance with the present invention.

This autocorrelation is important when the signal transmitted consists of a single period of a spreading code, as opposed to multiple periods of a spreading code. One important spreading code with good aperiodic autocorrelation is the Barker code. There are a limited number of possible Barker codes of lengths up to $L_c$=13. These are shown in the Table below. The aperiodic autocorrelation of Barker codes is no larger in absolute value than 1. The aperiodic autocorrelation is illustrated in FIG. 9 for the Barker code of length 11.

| $L_c$ | Code |
| --- | --- |
| 2 | +1, −1 |
| 3 | +1, +1, −1 |
| 4 | +1, +1, −1, +1 |
| 5 | +1, +1, +1, −1, +1 |
| 7 | +1, +1, +1, −1, −1, +1, −1 |
| 11 | +1, +1, +1, −1, −1, −1, +1, −1, −1, +1, −1 |
| 13 | +1, +1, +1, +1, +1, −1, −1, +1, +1, −1, +1, −1, +1 |

Figure 10:
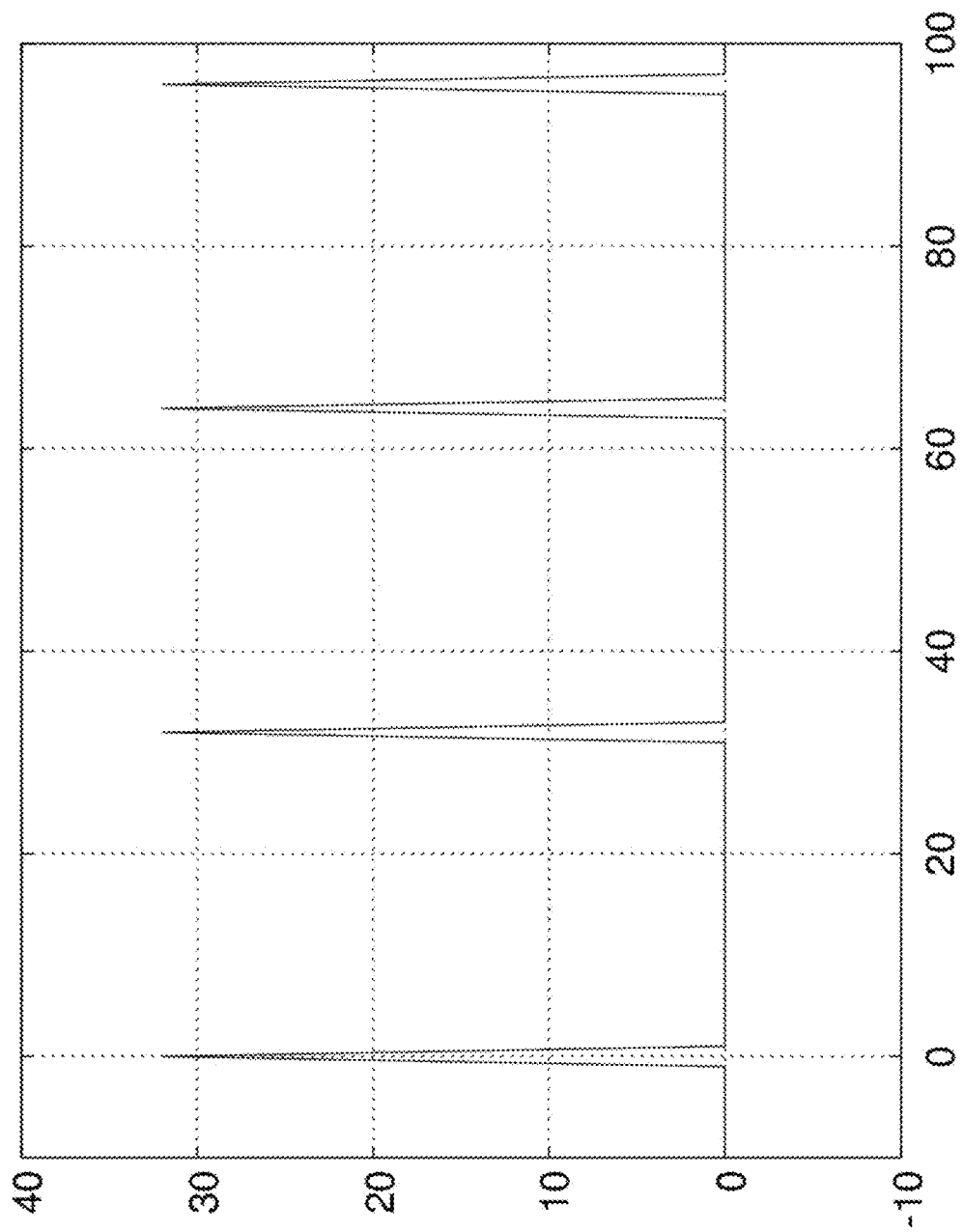
FIG. 10 is a plot of a periodic autocorrelation function of a Frank-Zadoff-Chu sequence of length 32 in accordance with the present invention.

Another class of codes is the Frank-Zadoff-Chu codes. Unlike Barker codes or m-sequences, which are binary codes, the Frank-Zadoff-Chu codes are sequences of complex numbers, where each complex number is on the unit circle. That is, a plot of each sequence element on the complex plane (real part is the horizontal axis, imaginary part is the vertical axis) lies on the unit circle. The codes can be defined when $L_c$ is even, as $$u_n = e^{-j\frac{\pi n^2}{L_c}}, n = 0, 1, 2, \ldots L_c - 1$$

$$u_n = e^{-j\frac{\pi n(n+1)}{L_c}}, n = 0, 1, 2, \ldots L_c - 1$$

for when $L_c$ is odd. The value of the periodic autocorrelation function $\theta_u(l)$ is $L_c$ for l mod $(L_c)=0$, and is 0 for l mod $(L_c)\neq 0$. This is the ideal autocorrelation. Note that, in general for complex sequences, the autocorrelation function is a complex number which contains a real part and an imaginary part. Two real correlations are needed to compute the real part of the autocorrelation and two real correlations are needed to compute the imaginary part of the correlation. Generally, the received signal after down-conversion and sampling is a complex number. For real transmitted sequences, two correlations are needed: a correlation of the real transmitted sequence with the real part of the received sequence and a correlation of the real transmitted sequence with the imaginary part of the received sequence. For FZC sequences, the periodic autocorrelation function is (ideally) purely real. That is, the imaginary part is zero. The real part of the periodic autocorrelation is illustrated in FIG. 10 for the case of $L_c=32$. For $L_c=6$, the FZC sequence corresponds to points on the unit circle with angles with respect to the positive horizontal axis of [0, −30, −120, 90, −120, −30]. While these codes have the ideal autocorrelation function, they also generate complex (as opposed to purely real) spreading codes. Furthermore, the real and imaginary parts of the code are not just binary (e.g. +1, −1) values, but can also be arbitrary numbers. For example, the second component of the above sequence is the complex number $$\frac{\sqrt{3}}{2} - \frac{j}{2},$$

where $j=\sqrt{(-1)}$.

There are various other codes, including Golay codes, almost perfect autocorrelation sequences (APAS), and Hadamard codes. Codes with good autocorrelation functions are desired in a radar system. Complex codes require more storage than binary codes. Long codes are generally desirable because the autocorrelation function is generally better, the longer the code. Generating codes at a high chip rate is also desirable. Furthermore, codes that are unpredictable are also desirable.

Figure 11:
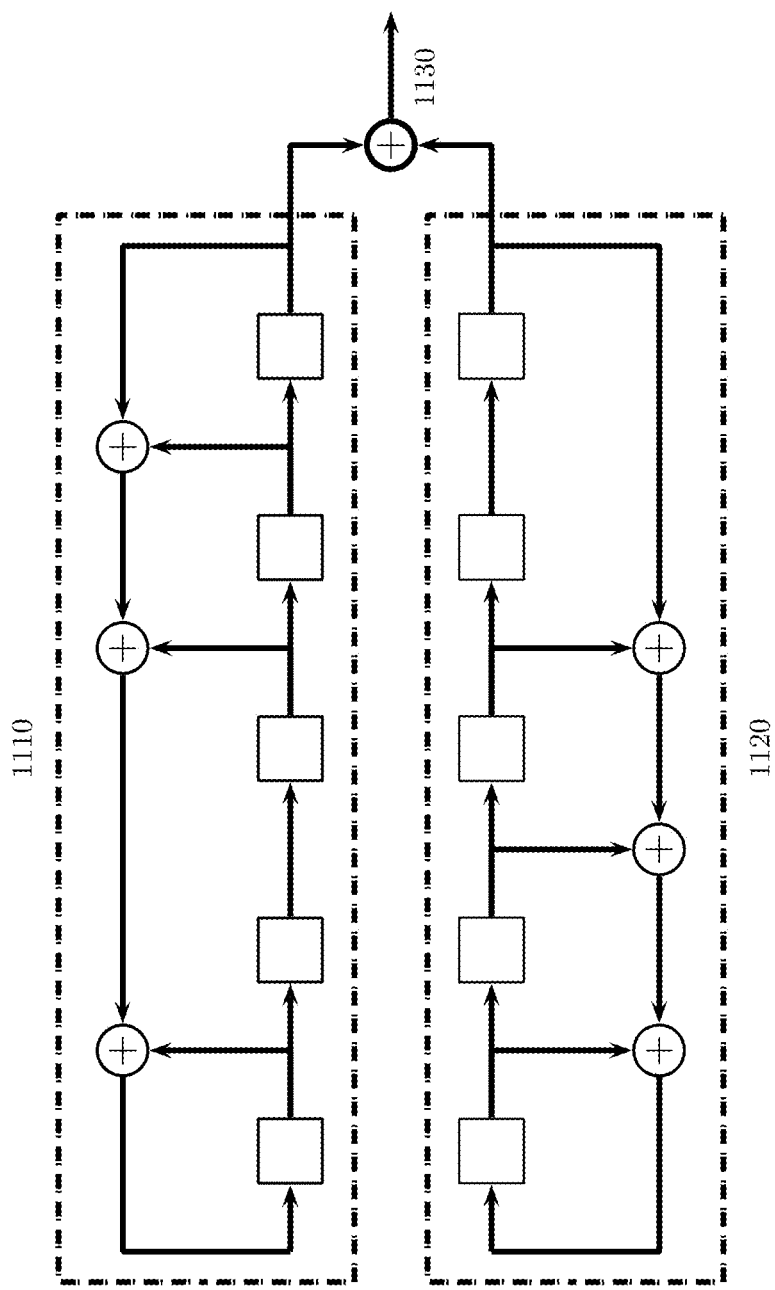
FIG. 11 is a block diagram of a Gold code generator in accordance with the present invention.

Codes used for different transmitters that have low cross-correlation are desirable. The periodic cross-correlation function between a code sequence $u_l$, l=0, 1, . . . , $L_c$−1 and a code sequence $v_l$, l=0, 1, . . . , $L_c$−1 is defined as:

$$\theta_{u,v}(l) = \sum_{n=0}^{L_c} u_n v_{n+l}^*, l = 0, 1, 2, \ldots$$

where again either the code sequence repeats or the index for the sequences are determined modulo $L_c$. One class of codes with interesting cross-correlation properties is known as Gold codes. The Gold codes can be formed from two m-sequences of the same length. FIG. 11 illustrates an exemplary way to generate a Gold code. The method illustrated in FIG. 11 involves modulo 2 adding (1130) the output of two m-sequence generators (1110) and (1120). Depending on the seed values, different Gold codes are generated. If either of the two (but not both) of the generators (1110, 1120) is started with all zeros in the shift register, then the output is just the m-sequence of the other shift register and this is considered one of the Gold codes. By changing the nonzero seed of one m-sequence generator with respect to the seed of the other m-sequence generator, different codes are generated. For the example illustrated in FIG. 11, where the shift register has 5 memory elements and the m-sequences generated are of length 31, there are 33 possible Gold codes. The autocorrelation properties of Gold codes are not as good as m-sequences, but there are more such sequences. For example, there are only 3 m-sequences of length 31 (not counting reverses of an m-sequence), but there are 33 possible Gold codes. There are alternative ways of implementing Gold code generators, known in the art, including using a single shift register of a length that is twice the length of the individual shift registers illustrated in FIG. 11. That is, a single shift register of length 10, with appropriate feedback connections, can generate different Gold codes depending on the initial contents.

Another set of codes are the Hadamard codes, which can be defined recursively when the length is a power of 2. Namely $$H_2 = \begin{bmatrix} +1 & +1 \\ -1 & +1 \end{bmatrix}$$

$$H_4 = \begin{bmatrix} H_2 & H_2 \\ -H_2 & H_2 \end{bmatrix}$$

$$H_n = \begin{bmatrix} H_{n/2} & H_{n/2} \\ -H_{n/2} & H_{n/2} \end{bmatrix}$$

The rows in a Hadamard matrix are orthogonal. That is, the periodic cross correlation between two sequences u and v is 0, at offset 0; $\theta_{u,v}(0)=0$. This is useful when different rows of a Hadamard matrix are used as the spreading codes. However, the autocorrelation of the codes is not good. A combination of codes is possible that have good autocorrelation function properties, and are orthogonal as well, when the sequences are synchronized at different transmitters.

Figure 12:
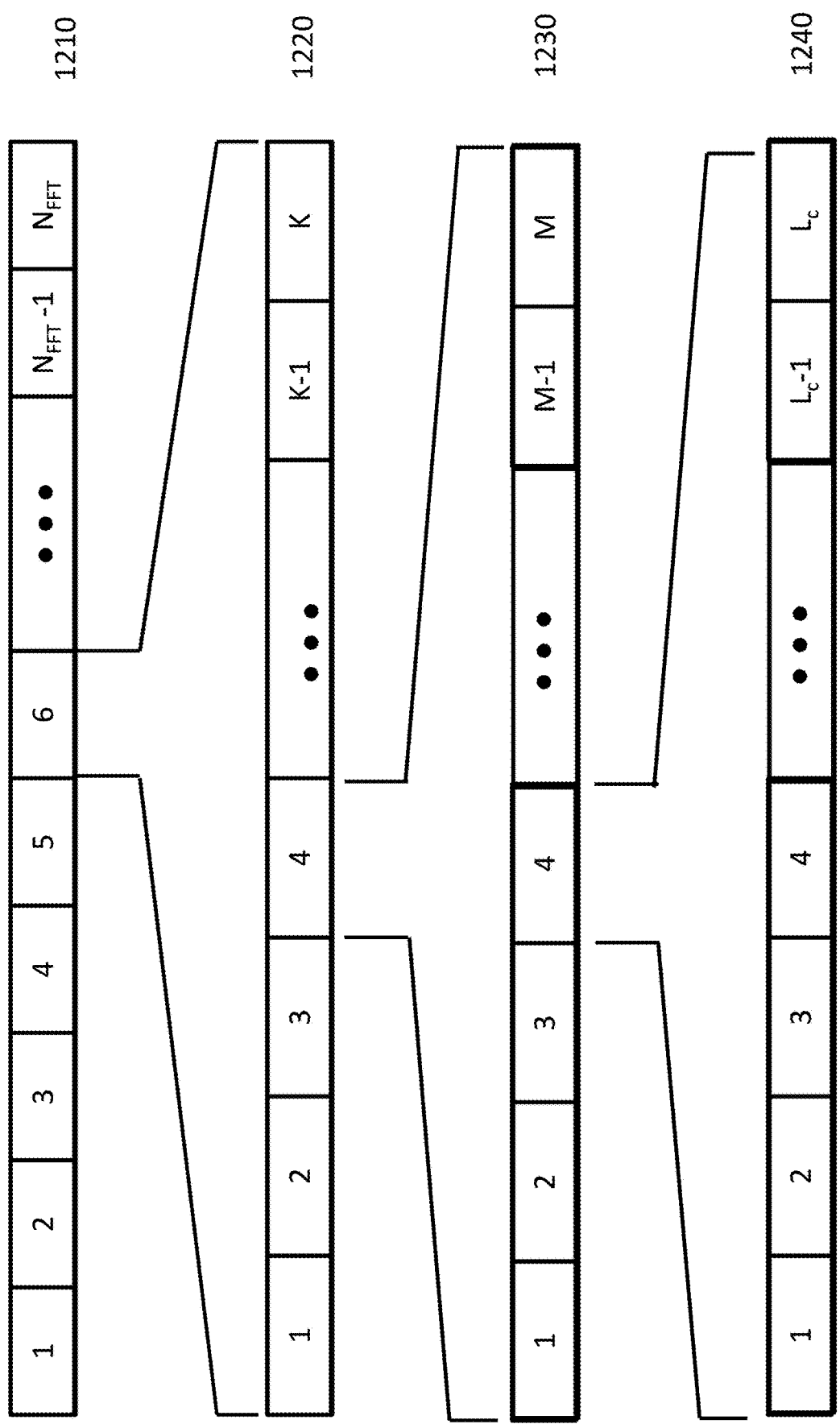
FIG. 12 is a block diagram of a spreading code that is generated from several constituent codes in accordance with the present invention.

In one embodiment, an exemplary spreading code is generated from several constituent codes. This is illustrated in FIG. 12. A first constituent code is a spreading code of length $L_c$ chips (1240). This could be an m-sequence (PRBS) generated by a shift register. This code can be repeated M times (1230), where M≥1, and then the code is combined with a Hadamard code of size K (1220) across different transmitters. This combination is then varied for $N_{FFT}$ times (1210). The total length of the spreading code is then $L_c$M K $N_{FFT}$. In this case, the Hadamard code is combined with, for example, an m-sequence generated in a feedback shift register repeated M times. There is additional possible variation on the spreading code, in the case when a Golay code is used. Because the Golay code requires two constituent codes, for which the sum of the autocorrelation functions has desirable properties, there is an additional requirement of transmitting two codes of length $L_c$, so that the overall spreading code length is now 2 $L_c$ M K $N_{FFT}$.

One way to combine different sequences is via a Kronecker product operation. The Kronecker product of a sequence $x_1$, $x_2$, $x_3$ that is of length 3, with a sequence $y_1$, $y_2$, that is of length 2, is the sequence $x_1y_1$, $x_2y_1$, $x_3y_1$, $x_1y_2$, $x_2y_2$, $x_3y_2$, that is of length 6.

Figure 13:
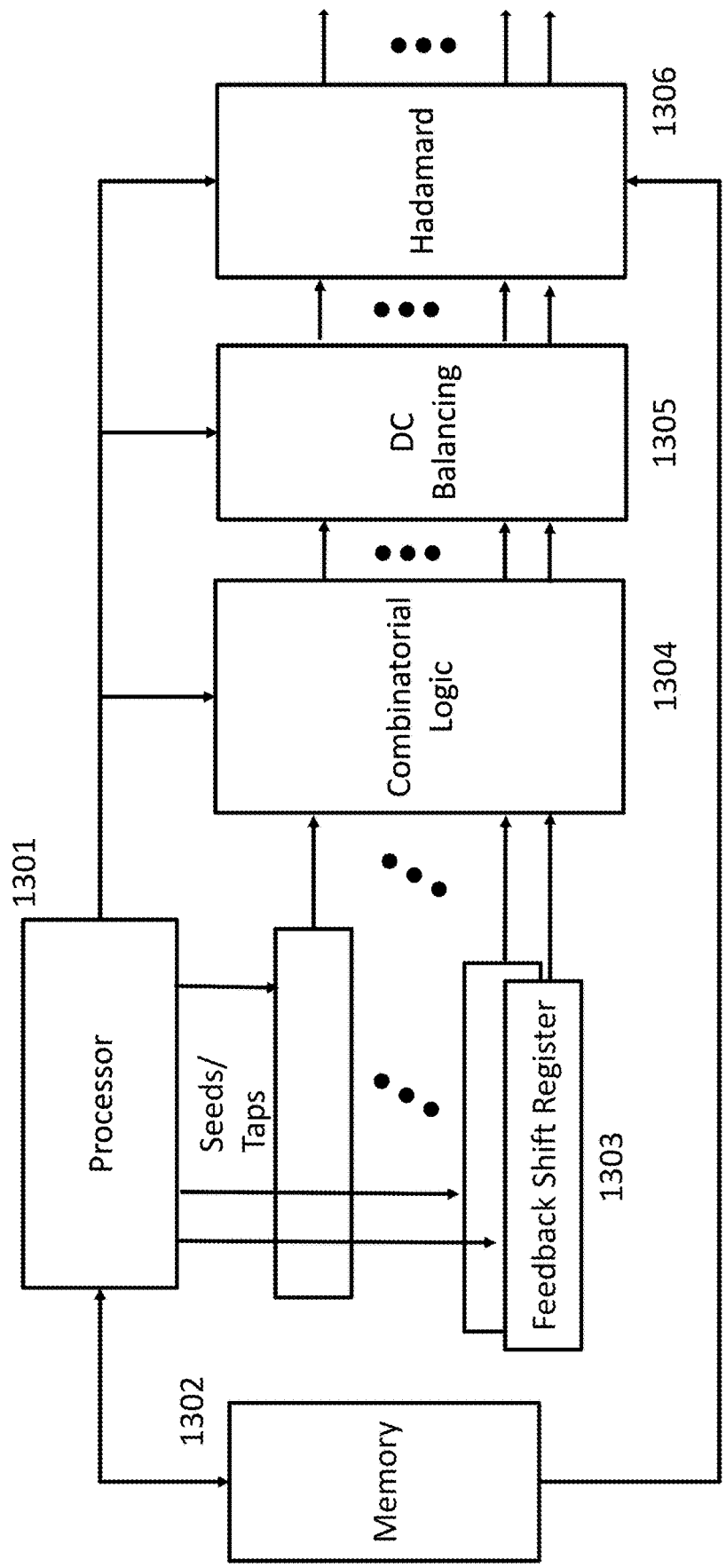
FIG. 13 is a block diagram illustrating an exemplary structure of a programmable code generator in accordance with the present invention.

While it is possible to use a conventional general-purpose processor to generate any possible code, the processor would need to operate with a clock cycle several times as fast as the chip rate. A chip rate of 1 Gchips/second would require a processor that is difficult or costly to implement. In one embodiment illustrated in FIG. 13, an exemplary programmable code generation unit 1300 includes a control processor 1301, a memory 1302, programmable shift registers 1303, a combinatorial logic 1304, a DC balancing subsystem 1305, and a Hadamard processing subsystem 1306. The structure of the programmable code generator 1300 contains a processor 1301 that can access the memory 1302, control the shift registers 1303, the combinatorial logic 1304, the DC balancing subsystem 1305, and the Hadamard processing subsystem 1306.

The programmable code generator 1300 contains preferably 48 shift registers of 31 memory elements each, that can be programmed to generate any desired feedback connection, as well as loaded with any seed sequence. The shift registers 1303 can be programmed to generate an m-sequence of length $2^{31}-1$. The feedback shift registers 1303 can also be shortened in length via feeding back from any set of desired elements in the register which might not include the last element. In this implementation, the last element and potentially other elements, become pure delay elements. The feedback shift register generators can be loaded with any contents (sometimes called the seed) and generators can be configured via software to have any set of feedback connections desired. The structure of the programmable code generator 1300 also has memory 1302 that can store chips used in an arbitrary sequence up to the size of the memory 1302. For example, the memory 1302 could store Hadamard sequences that are read by the processor 1301 and then combined with shift register sequences in the Hadamard processing block 1306. The memory 1302 can store actual chip sequences for different transmitters. One mode of operation, known as range domain MIMO, uses the full memory to provide a first chip sequence for one transmitter. The sequences for the other transmitters are then delayed versions of the first chip sequence. In one embodiment, the memory 1302 has the storage capacity to allow for 12 sequences of length 192K chips.

The memory 1302 can store the seeds and taps to control the feedback shift registers 1303. The processor 1301 can pick a random seed for the shift registers 1303 to choose different sequences instead of deterministically traversing the memory 1302 in a fixed sequence.

The combinatorial logic 1304 can be used for a variety of purposes. In one embodiment, the combinatorial logic 1304 performs exclusive OR (XOR) operations on different streams and can also be used to define which shift register stream goes to which transmitter. Alternatively, one code may be forwarded to all transmitters.

In one embodiment, the DC balancer 1305 first tracks the DC balance. The DC balance is the sum of the quantity of chips that take a value=1 in the past/chips, minus the sum of the quantity of chips that take a value=0 over the same interval. The DC balancer 1305 can be configured to control a maximum absolute value of the DC balance a chip stream may have, called the DC threshold. The DC threshold is configurable but preferably 20. Once the DC balance reaches the threshold the DC balancer will flip the next chip if that chip would cause the DC balance to exceed the DC threshold. Otherwise the DC balancer need not flip the next bit and the DC balance will improve. If the chip sequence is a finite length sequence then the DC balancer can force the DC balance to zero at the end of the sequence by forcing the appropriate last number of bits (e.g. 20) so that the DC balance at the end is zero. Alternatively, the DC balancer can slowly decrease the maximum DC balance threshold when the number of chips left in the finite sequence is smaller than some value. For example, for a sequence of length 512 with a maximum DC balance of 20 when there are 60 chips left in the sequence the DC balancer can reduce the maximum DC balance by 1 every three chips. So that by the time there are only 3 chips left the DC balance is at most 1. At that point, it can reduce the DC balance to zero by forcing the last chip to a value that causes the DC balance to 0 over the whole sequence.

The DC balancer 1305 may also flip an entire sequence of bits, or may take the previous sequence of bits over a range of bits, flip all the bits in the sequence and then used the flipped bits as the spreading code. The DC balancer can also take the flipped bits and do a permutation of the sequence of flipped bits and transmit that sequence. The DC balancer may insert either zeros or ones (0s, 1s) into any of the chip sequences as well.

The DC balancer 1305 may also balance the code across different transmitters over a configured interval. The DC balancer with multiple transmitters checks the DC balance across the different transmitters. If the absolute DC balance across transmitters exceeds a threshold then the DC balancer can change a chip in one of the transmitters. For example, if the DC balance across all transmitters for an individual chip in each of the transmitters exceeds the maximum value then the individual sequence with the worst DC balance in that individual sequence for which changing that chip can improve the DC balance across transmitters and improve the DC balance for the individual transmitter will have that chip flipped in sign. For example, suppose that there are eight transmitters and the individual DC balance for these transmitters is 2, −6, 8, −18, 12, −2, 3, 1 and for a particular chip the DC balance across transmitters is above a threshold, such as the eight chips are 0, 0, 1, 0, 0, 1, 0, 1. Then the DC balancer would need to change one of these chips from a 0 to a 1 in order to have a better balance. One of the transmitters that has a chip of 0 would need to change to 1 in order to improve the DC balance across chips. Transmitters 1, 3, 5, 7, and 8 have more ones than zeros while transmitters 2, 4, and 6 have more zeros than ones. The transmitter that would be changed would flip the bit would be transmitter 5 which would change the balance across transmitters to 2, −6, 8, −18, 10, −2, 3, 1 because what was a one before is removed and an addition zero is added to the balance for transmitter 5. While this will work to keep the DC balance across transmitters when the threshold for balancing an individual transmitter is reduced near the end of a sequence, the balance across transmitters can be eliminated because simultaneous balancing might require look ahead for the chip sequence.

The invention claimed is:
1. A radar sensing system comprising:
a plurality of transmitters configured to transmit radio signals; and
a plurality of receivers configured to receive radio signals that include the transmitted radio signals transmitted by the transmitters and reflected from objects in an environment;
wherein each transmitter of the plurality of transmitters is configured to receive a respective spreading code chip sequence of a plurality of spreading code chip sequences, and wherein each transmitter of the plurality of transmitters is configured to generate radio signals as defined by their respective spreading code chip sequences; and wherein each receiver of the plurality of receivers is configured to receive spreading code chip sequences corresponding to each of the respective spreading code chip sequences received by the plurality of transmitters, and wherein each receiver of the plurality of receivers is configured to process received radio signals as defined by the spreading code chip sequences.

2. The radar sensing system of claim 1 further comprising a code chip generator, wherein the spreading code chip sequences received by both the plurality of transmitters and the plurality of receivers are generated by the code chip generator.

3. The radar sensing system of claim 2, wherein the code chip generator comprises a controller, a plurality of feedback shift registers, a logic device, and a memory.

4. The radar sensing system of claim 3, wherein the controller is operable to configure the plurality of feedback shift registers with any set of feedback connections.

5. The radar sensing system of claim 3, wherein the logic device is configured to alter the output of the feedback shift registers in order to alter properties of sequences produced by the feedback shift registers, and wherein altering output of the feedback shift registers includes balancing the DC properties of the sequences, such that a sum of code chip values of 1 and 0 is below a DC threshold value.

6. The radar sensing system of claim 3, wherein the memory is configured to store spreading code chip sequences, and wherein the controller is operable to select a corresponding spreading code chip sequence of the stored spreading code chip sequences for each transmitter of the plurality of transmitters.

7. The radar sensing system of claim 6, wherein the memory is configured to store a first spreading code chip sequence, and wherein the code chip generator is configured to output the first spreading code chip sequence for a first transmitter of the plurality of transmitters, and further configured to output delayed versions of the first spreading code chip sequence for each of the other transmitters of the plurality of transmitters.

8. A method for controlling a radar sensing system comprising a plurality of transmitters and a plurality of receivers, the method comprising:
generating a plurality of spreading code chip sequences;
transmitting, with the transmitters, radio signals;
receiving, with the receivers, radio signals that include the transmitted radio signals transmitted by the transmitters and reflected from objects in an environment;
processing, with a first receiver of the plurality of receivers, the received radio signals and outputting processed radio signals;
wherein each transmitter of the plurality of transmitters receives a respective spreading code chip sequence of a plurality of spreading code chip sequences, and wherein each transmitter of the plurality of transmitters generates a modulated radio signal defined by their respective spreading code chip sequences; and
wherein each receiver of the plurality of receivers receives spreading code chip sequences corresponding to each of the respective spreading code chip sequences received by the plurality of transmitters, and wherein each receiver of the plurality of receivers processes received radio signals as defined by the spreading code chip sequences.

9. The method of claim 8, wherein the spreading code chip sequences comprise at least one of Hadamard sequences, Golay sequences, Frank-Zadoff-Chu sequences, and APAS sequences.

10. The method of claim 8, further comprising balancing a DC balance of the spreading codes, such that a sum of code chip values of 1 and 0 is below a DC threshold value.

11. The method of claim 8 further comprising selecting from a memory spreading code chip sequences from a plurality of spreading code chip sequences stored in the memory, such that a corresponding spreading code chip sequence is selected for each transmitter of the plurality of transmitters.

12. The method of claim 8 further comprising selecting from a memory a first spreading code chip sequence for outputting to a first transmitter of the plurality of transmitters, and outputting delayed versions of the first spreading code chip sequence to each of the other transmitters of the plurality of transmitters.

13. A radar sensing system comprising:
a plurality of transmitters configured to transmit radio signals; and
a plurality of receivers configured to receive radio signals that include the transmitted radio signals transmitted by the transmitters and reflected from objects in an environment;
wherein a first transmitter of the plurality of transmitters is configured to generate modulated radio signals as defined by a first spreading code chip sequence of a plurality of spreading code chip sequences;
wherein a second transmitter of the plurality of transmitters is configured to generate modulated radio signals as defined by a second spreading code chip sequence of the plurality of spreading code chip sequences; and
wherein a first receiver of the plurality of receivers is configured to process received radio signals as defined by at least the first and second spreading code chip sequences of the plurality of spreading code chip sequences.

14. The radar sensing system of claim 13, wherein both the plurality of transmitters and the plurality of receivers are configured to receive the spreading code chip sequences from a same source.

15. The radar sensing system of claim 14 further comprising a programmable code generation unit configured to generate the spreading code chip sequences received by both the plurality of transmitters and the plurality of receivers.

16. The radar sensing system of claim 14, wherein the source is configured to generate a plurality of different spreading code chip sequences.

17. The radar sensing system of claim 14, wherein the programmable code generation unit comprises a control processor and a plurality of feedback shift registers, and wherein the control processor is operable to configure the plurality of feedback shift registers with any set of feedback connections.

18. The radar sensing system of claim 17, wherein the programmable code generation unit also comprises logic configured to alter the output of the feedback shift registers in order to alter properties of spreading code chip sequences produced by the feedback shift registers, and wherein the logic is further configured to alter the output of the feedback shift registers to balance the DC properties of the spreading code chip sequences, such that a sum of code chip values of 1 and 0 is below a DC threshold value.

19. The radar sensing system of claim 17, wherein the programmable code generation unit further comprises a memory configured to store spreading code chip sequences, such that the control processor is configured to select corresponding spreading code chip sequences from the memory for each transmitter of the plurality of transmitters.

20. The radar sensing system of claim 19, wherein the memory is configured to store a first spreading code chip sequence, and wherein the programmable code generation unit is configured to output the first spreading code chip sequence for a first transmitter of the plurality of transmitters, and further configured to output delayed versions of the first spreading code chip sequence for each of the other transmitters of the plurality of transmitters.

* * * * *